(12) United States Patent
Wu et al.

(10) Patent No.: US 12,230,210 B2
(45) Date of Patent: Feb. 18, 2025

(54) DISPLAY SUBSTRATE AND METHOD OF DRIVING THE SAME, DISPLAY PANEL AND DISPLAY DEVICE

(71) Applicants: Hefei BOE Joint Technology Co., Ltd., Hefei (CN); BOE Technology Group Co., Ltd., Beijing (CN)

(72) Inventors: Liu Wu, Beijing (CN); Can Yuan, Beijing (CN); Zhidong Yuan, Beijing (CN); Cheng Xu, Beijing (CN); Luke Ding, Beijing (CN); Yongqian Li, Beijing (CN); Xiuting Liu, Beijing (CN)

(73) Assignees: Heifei BOE Joint Technology Co., Ltd., Heifei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/547,182

(22) PCT Filed: Sep. 30, 2022

(86) PCT No.: PCT/CN2022/123225
§ 371 (c)(1),
(2) Date: Aug. 21, 2023

(87) PCT Pub. No.: WO2024/065660
PCT Pub. Date: Apr. 4, 2024

(65) Prior Publication Data
US 2024/0233644 A1 Jul. 11, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0814* (2013.01);
(Continued)

(58) Field of Classification Search
CPC .................................................. H10K 59/00–95
See application file for complete search history.

(56) References Cited

U.S. PATENT DOCUMENTS 10,297,202 B2   5/2019   Xiang et al.
10,672,345 B2   6/2020   Xiang et al.
(Continued)

FOREIGN PATENT DOCUMENTS

CN   106448560 A   2/2017
CN   106531085 A   3/2017
(Continued)

*Primary Examiner* — Sanjiv D. Patel
(74) *Attorney, Agent, or Firm* — Westman, Champlin & Koehler, P.A.

(57) ABSTRACT

A display substrate, including: a plurality of partition control signal lines disposed on a base substrate; and a plurality of sub-pixels disposed on the base substrate, at least one of the sub-pixels includes a pixel circuit and a light emitting device. The pixel circuit includes a switch transistor, a first partition control transistor, a drive transistor and a first initialization transistor. The first partition control transistor is electrically connected to the switch transistor, the first initialization transistor, the drive transistor and at least one partition control signal line. The first partition control transistor is configured to: in response to a partition control signal on the partition control signal line, selectively transmit a received first initialization signal to a gate electrode of the drive transistor in an initialization phase, and selectively transmit a received data signal to the gate electrode of the drive transistor in a data writing phase.

19 Claims, 14 Drawing Sheets

(52) U.S. Cl.
CPC .............. *G09G 2300/0819* (2013.01); *G09G 2300/0842* (2013.01); *G09G 2310/0221* (2013.01); *G09G 2310/04* (2013.01); *G09G 2310/08* (2013.01); *G09G 2330/021* (2013.01); *G09G 2340/0435* (2013.01)

(56) References Cited

U.S. PATENT DOCUMENTS

| | | |
|---|---|---|
| 10,796,631 B2 | 10/2020 | Hung et al. |
| 11,263,960 B2 | 3/2022 | Xiong et al. |
| 11,645,977 B2 | 5/2023 | Chen et al. |
| 2017/0243542 A1 | 8/2017 | Xiang et al. |
| 2017/0249900 A1 | 8/2017 | Xiang et al. |
| 2020/0074919 A1 | 3/2020 | Hung et al. |
| 2020/0410924 A1 | 12/2020 | Xiong et al. |
| 2021/0272517 A1 | 9/2021 | Chen et al. |
| 2023/0368736 A1* | 11/2023 | No ..................... G09G 3/3233 |
| 2024/0013705 A1 | 1/2024 | Wang et al. |

FOREIGN PATENT DOCUMENTS

| | | |
|---|---|---|
| CN | 109272936 A | 1/2019 |
| CN | 110111738 A | 8/2019 |
| CN | 111489700 A | 8/2020 |
| CN | 111739464 A | 10/2020 |
| CN | 111986612 A | 11/2020 |
| CN | 112951154 A | 6/2021 |
| JP | 2004-151275 A | 5/2004 |

\* cited by examiner

DISPLAY SUBSTRATE AND METHOD OF DRIVING THE SAME, DISPLAY PANEL AND DISPLAY DEVICE

CROSS REFERENCE TO RELATED APPLICATION(S)

This application is a Section 371 National Stage Application of International Application No. PCT/CN2022/123225, filed on Sep. 30, 2022, the whole disclosure of which is incorporated herein by reference in its entirety.

TECHNICAL FIELD

The present disclosure relates to the field of display technology, and in particular, to a display substrate and a method of driving a display substrate, a display panel and a display device.

BACKGROUND

An organic light emitting diode (OLED) display device is a kind of display device that uses luminous OLEDs to display information such as images, etc. The OLED display device has characteristics such as low power consumption, high brightness, high response speed, etc. With the development of the OLED technology, the demand for the display effect is getting higher and higher, and performance parameters such as the refresh rate, etc. are required to be continuously improved.

The above-mentioned information disclosed in the section is merely for an understanding of the background of the technical concept of the present disclosure. Therefore, the above-mentioned information may contain information that does not constitute the related art.

SUMMARY

In an aspect, a display substrate is provided, the display substrate comprising a display region and a non-display region. The display substrate comprises: a base substrate; a plurality of data signal lines, a plurality of first scanning signal lines, a plurality of partition control signal lines, a plurality of first initialization signal lines and a plurality of second scanning signal lines disposed on the base substrate; and a plurality of sub-pixels disposed on the base substrate and located in the display region, wherein the plurality of sub-pixels are arranged in an array in a first direction and a second direction in the display region, the first direction intersects the second direction, and at least one of the plurality of sub-pixels comprises a pixel circuit and a light emitting device, wherein the pixel circuit comprises a switch transistor, a first partition control transistor, a drive transistor and a first initialization transistor; wherein the switch transistor is electrically connected to at least one of the plurality of first scanning signal lines and at least one of the plurality of data signal lines, the first initialization transistor is electrically connected to at least one of the plurality of first initialization signal lines and at least one of the plurality of second scanning signal lines, the drive transistor is electrically connected to the light emitting device, and the first partition control transistor is electrically connected to the switch transistor, the first initialization transistor, the drive transistor and at least one of the plurality of partition control signal lines; and wherein the switch transistor is configured to: transmit a data signal on the data signal line to the first partition control transistor in response to a first scanning signal on the first scanning signal line; the first initialization transistor is configured to: transmit a first initialization signal on the first initialization signal line to the first partition control transistor in response to a second scanning signal on the second scanning signal line; the first partition control transistor is configured to: in response to a partition control signal on the partition control signal line, selectively transmit a received first initialization signal to a gate electrode of the drive transistor in an initialization phase and selectively transmit a received data signal to the gate electrode of the drive transistor in a data writing phase; and the drive transistor is configured to: provide a drive signal to the light emitting device in response to a voltage difference between the gate electrode of the drive transistor and a first electrode of the drive transistor.

According to some exemplary embodiments, in one and same pixel circuit, in the second direction, an orthographic projection of the first partition control transistor on the base substrate is located between an orthographic projection of the first initialization transistor on the base substrate and an orthographic projection of the drive transistor on the base substrate.

According to some exemplary embodiments, in one and same pixel circuit, an orthographic projection of the first partition control transistor on the base substrate and an orthographic projection of the switch transistor on the base substrate are arranged in the first direction.

According to some exemplary embodiments, the display substrate further comprises a plurality of light emitting control signal lines and a plurality of first power lines disposed on the base substrate; wherein the pixel circuit further comprises a light emitting control transistor electrically connected to the drive transistor, at least one of the plurality of light emitting control signal lines and at least one of the plurality of first power lines; wherein the light emitting control transistor is configured to: transmit a first voltage signal on the first power line to the first electrode of the drive transistor in response to a light emitting control signal on the light emitting control signal line; and wherein in one and same pixel circuit, an orthographic projection of the light emitting control transistor on the base substrate is located on a side of an orthographic projection of the drive transistor on the base substrate away from an orthographic projection of the first partition control transistor on the base substrate.

According to some exemplary embodiments, the display substrate further comprises a plurality of second partition control transistors, a plurality of third scanning signal lines and a plurality of second initialization signal lines disposed on the base substrate, and at least one of the plurality of second partition control transistors is electrically connected to at least one of the plurality of partition control signal lines, at least one of the plurality of second initialization signal lines and pixel circuits in the plurality of sub-pixels; and wherein the at least one of the second partition control transistors is configured to: selectively transmit a second initialization signal on the second initialization signal line to the pixel circuit electrically connected to the second partition control transistor, in response to a partition control signal on the partition control signal line.

According to some exemplary embodiments, the pixel circuit further comprises a second initialization transistor, the pixel circuit is electrically connected to the second partition control transistor through the second initialization transistor, and the second initialization transistor is further electrically connected to the drive transistor and at least one of the plurality of third scanning signal lines; and the second initialization transistor is configured to: transmit a received second initialization signal to the first electrode of the drive transistor in response to a third scanning signal on the third scanning signal line.

According to some exemplary embodiments, in one and same pixel circuit, an orthographic projection of the second initialization transistor on the base substrate is located on a side of an orthographic projection of the drive transistor on the base substrate away from an orthographic projection of the first partition control transistor on the base substrate.

According to some exemplary embodiments, an orthographic projection of the at least one of the second partition control transistors on the base substrate and an orthographic projection of the second initialization transistor of the pixel circuit electrically connected to the at least one of the second partition control transistors are arranged in the first direction.

According to some exemplary embodiments, an orthographic projection of the at least one of the second partition control transistors on the base substrate at least partially overlaps with an orthographic projection of the partition control signal line electrically connected to the at least one of the second partition control transistors on the base substrate.

According to some exemplary embodiments, for the at least one of the second partition control transistors and the pixel circuit electrically connected to the at least one of the second partition control transistors, the second partition control transistor and the first partition control transistor in the pixel circuit are electrically connected to one and same partition control signal line.

According to some exemplary embodiments, a plurality of pixel circuits electrically connected to the at least one of the second partition control transistors are arranged in the first direction and disposed adjacent to each other.

According to some exemplary embodiments, the display substrate comprises a plurality of pixel cells, at least one of the plurality of pixel cells comprises a plurality of sub-pixels with different colors, and in the first direction, the plurality of pixel cells comprise a first pixel cell and a second pixel cell arranged alternately; and in the plurality of pixel circuits electrically connected to the at least one second partition control transistor, a part of the plurality of pixel circuits belong to the sub-pixels in the first pixel cell, and the other part of the pixel circuits belong to the sub-pixels in the second pixel cell.

According to some exemplary embodiments, pixel circuits in the plurality of sub-pixels are arranged in an array in the first direction and the second direction; and the at least one of the partition control signal lines is electrically connected to the first partition control transistor in a plurality of columns of pixel circuits, and different partition control signal lines are electrically connected to the first partition control transistors in different columns of pixel circuits.

According to some exemplary embodiments, pixel circuits in the plurality of sub-pixels are arranged in an array in the first direction and the second direction; and the at least one of the partition control signal lines is electrically connected to the first partition control transistor in a plurality of columns of pixel circuits, and different partition control signal lines are electrically connected to the first partition control transistors in different columns of pixel circuits.

According to some exemplary embodiments, the at least one of the partition control signal lines extends in the second direction, and an orthographic projection of at least one of the partition control signal lines on the base substrate is located between orthographic projections of two adjacent sub-pixels in the first pixel cell on the base substrate.

According to some exemplary embodiments, orthographic projections of the plurality of partition control signal lines on the base substrate are spaced apart from an orthographic projection of the second pixel cell on the base substrate.

According to some exemplary embodiments, the display substrate further comprises a plurality of flip-chip thin films disposed on the base substrate and located in the non-display region, at least one of the plurality of flip-chip thin films is electrically connected to the plurality of partition control signal lines, and different flip-chip thin films are electrically connected to different partition control signal lines; and the at least one of the plurality of flip-chip thin films is capable of providing different partition control signals for at least two of the plurality of partition control signal lines electrically connected to the at least one of the plurality of flip-chip thin films.

According to some exemplary embodiments, the non-display region comprises a first sub-region located on a first side of the display region, the plurality of flip-chip thin films are disposed in the first sub-region, the display substrate further comprises a plurality of partition control signal leads and a first initialization signal lead disposed on the base substrate and located in the first sub-region, and the first initialization signal lead and the plurality of partition control signal leads all extend in the first direction; wherein the plurality of first initialization signal lines are electrically connected to the first initialization signal lead; wherein at least one of the plurality of flip-chip thin films is electrically connected to a corresponding partition control signal line through the plurality of partition control signal leads; and wherein an orthographic projection of the partition control signal lead on the base substrate is located on a side of an orthographic projection of the first initialization signal lead on the base substrate away from an orthographic projection of the display region on the base substrate.

According to some exemplary embodiments, the at least one of the flip-chip thin films comprises a first partition control terminal and a second partition control terminal, the first partition control terminal and the second partition control terminal are capable of providing different partition control signals, and the plurality of the partition control signal leads comprise a first partition control signal lead and a second partition control signal lead arranged alternately in the first direction; and for the plurality of partition control signal lines electrically connected to at least one of the flip-chip thin films, a part of the plurality of partition control signal lines are electrically connected to the first partition control terminal through the first partition control signal lead, and the other part of the plurality of partition control signal lines are electrically connected to the second partition control terminal through the second partition control signal lead.

According to some exemplary embodiments, the plurality of the partition control signal lines electrically connected to the first partition control terminal are arranged in the first direction and disposed adjacent to each other, and the plurality of the partition control signal lines electrically connected to the second partition control terminal are arranged in the first direction and disposed adjacent to each other.

According to some exemplary embodiments, the display substrate further comprises a first power lead disposed on the base substrate and located in the first sub-region, and the first power lead extends in the first direction; the first power lead is electrically connected to a plurality of first power lines; and the orthographic projection of the partition control signal lead on the base substrate is located between the orthographic projection of the first initialization signal lead on the base substrate and an orthographic projection of a first power lead the base substrate.

According to some exemplary embodiments, the display substrate comprises: a semiconductor layer disposed on the base substrate; a first gate layer disposed on a side of the semiconductor layer away from the base substrate; a second gate layer disposed on a side of the first gate layer away from the base substrate; a first metal conductive layer disposed on a side of the second gate layer away from the base substrate; a second metal conductive layer disposed on a side of the first metal conductive layer away from the base substrate; and a first electrode layer disposed on a side of the second metal conductive layer away from the base substrate, the plurality of partition control signal leads and a plurality of the first initialization signal leads are all located in the second metal conductive layer.

According to some exemplary embodiments, the display substrate further comprises: a plurality of bridging lines disposed on the base substrate and located in the first sub-region, the plurality of bridging lines are located in the first metal conductive layer; a plurality of first connecting lines disposed on the base substrate and located in the first sub-region; a plurality of second connecting lines disposed on the base substrate and located in the first sub-region, wherein at least a part of the second connecting lines is located in the second metal conductive layer, the first initialization signal lead is electrically connected to a first end of at least one of the plurality of first connecting lines by crossing at least one of the plurality of partition control signal leads through at least one of the plurality of bridging lines, and a second end of the first connecting line is electrically connected to at least one of the flip-chip thin films; at least one of the plurality of partition control signal leads is electrically connected to at least one of the flip-chip thin films through at least one of the plurality of second connecting lines, and for at least one of the plurality of partition control signal leads, the partition control signal lead comprises a first part electrically connected to the second connecting line and a second part crossed by the bridging line, and an orthographic projection of the first part on the base substrate is spaced apart from an orthographic projection of the second part on the base substrate.

According to some exemplary embodiments, for at least one of the plurality of partition control signal leads, the orthographic projection of the first part on the base substrate is located between the orthographic projection of the second part on the base substrate and an orthographic projection of a center of the partition control signal lead on the base substrate.

According to some exemplary embodiments, the display substrate further comprises a first insulating layer disposed between the first metal conductive layer and the second metal conductive layer, and a plurality of first via holes and a plurality of second via holes are provided on the first insulating layer; at least one of the bridging lines is electrically connected to the first initialization lead through at least one of the plurality of first via holes, and the at least one of the bridging lines is electrically connected to at least one of the first connecting lines through at least one of the second via holes; and an orthographic projection of at least one of the first via holes on the base substrate at least partially overlaps with the orthographic projection of the first initialization lead on the base substrate, a recess is provided on at least one of the partition control signal leads, and an orthographic projection of the recess on the base substrate at least partially overlaps with an orthographic projection of at least one of the second via holes on the base substrate.

According to some exemplary embodiments, at least one of the first via holes and at least one of the second via holes are arranged in the second direction.

According to some exemplary embodiments, at least one of the first connecting lines comprises a first connecting part and a second connecting part, and at least one of the second connecting lines comprises a third connecting part and a fourth connecting part; wherein for one and same first connecting line, a first end of the first connecting part is electrically connected to at least one of the bridging lines, and a second end of the first connecting part is electrically connected to at least one of the flip-chip thin films through the second connecting part; wherein for one and same second connecting line, a first end of the third connecting part is electrically connected to at least one of the partition control signal leads, and a second end of the third connecting part is electrically connected to at least one of the flip-chip thin films through the fourth connecting part; and wherein the first connecting part and the third connecting part are both located in the second metal conductive layer, and the second connecting part and the fourth connecting part are both located in the first metal conductive layer.

According to some exemplary embodiments, the display substrate further comprises a first insulating layer disposed between the first metal conductive layer and the second metal conductive layer, and a plurality of third via holes and a plurality of fourth via holes are provided on the first insulating layer; wherein for one and same first connecting line, the first connecting part is electrically connected to the second connecting part through at least one of the third via holes; wherein for one and same second connecting line, the third connecting part is electrically connected to the fourth connecting part through at least one of the fourth via holes; wherein an orthographic projection of a connecting line between two adjacent third via holes on the base substrate is located on a side of an orthographic projection of a connecting line between two adjacent fourth via holes on the base substrate away from the orthographic projection of the display region on the base substrate.

According to some exemplary embodiments, the partition control signal line and the first initialization signal line are both located in the second metal conductive layer.

In another aspect, a display panel is provided, including the display substrate described above.

In yet another aspect, a display device is provided, including the display panel described above.

In still another aspect, a method of driving the display substrate described above is provided, the method includes: controlling the plurality of sub-pixels in a first display region to refresh at a first refresh rate, in response to a first partition control signal on at least one of the plurality of partition control signal lines; and controlling the plurality of sub-pixels in a second display region to refresh at a second refresh rate, in response to a second partition control signal on at least another of the plurality of partition control signal lines, wherein the first display region and the second display region are different sub-regions of the display region, respectively, and the first refresh rate is higher than the second refresh rate.

BRIEF DESCRIPTION OF THE DRAWINGS

Features and advantages of the present disclosure will become more apparent through detailed descriptions of exemplary embodiments of the present disclosure with reference to accompanying drawings.

FIG. 21 to FIG. 25 are schematic plan views of main film layers in FIG. 20, in which FIG. 21 is a schematic plan view of the first gate layer, FIG. 22 is a schematic plan view of the first metal conductive layer, FIG. 23 is a schematic plan view of a spacer layer (such as the first insulating layer R1 and the first passivation layer PVX1 described above), FIG. 24 is a schematic plan view of the second metal conductive layer, and FIG. 25 is a schematic plan view of the first electrode layer.

DETAILED DESCRIPTION OF EMBODIMENTS

Figure 1:
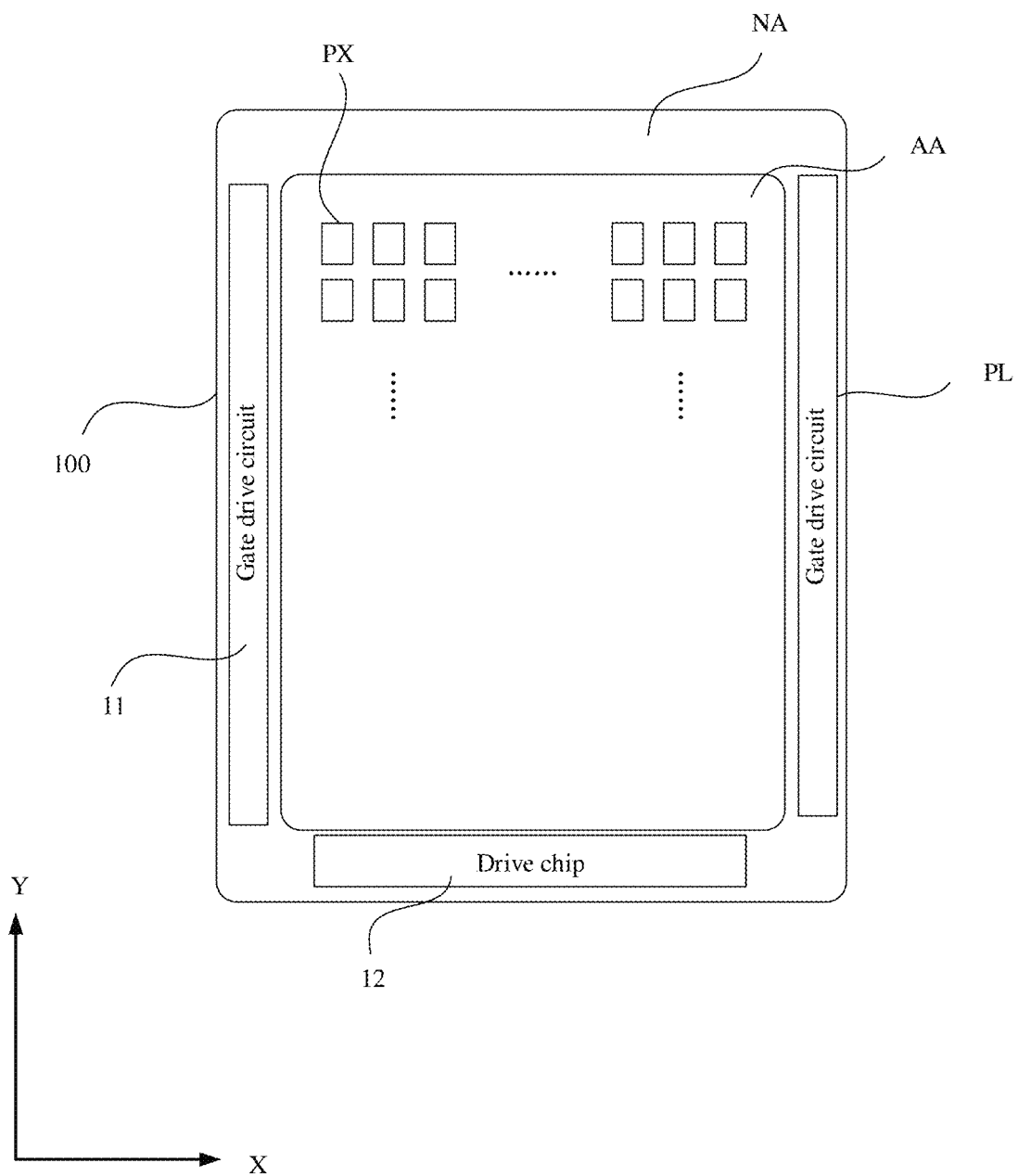
FIG. 1 is a schematic diagram of a display substrate in the related art.

In order to make objectives, technical solutions and advantages of the present disclosure clearer, the technical solution in embodiments of the present disclosure will be described clearly and completely with reference to accompanying drawings. Obviously, the described embodiments are some, but not all of embodiments of the present disclosure. Based on the described embodiments of the present disclosure, all other embodiments obtained by those skilled in the art without any creative work fall within the scope of protection of the present disclosure.

It should be noted that in the accompanying drawings, a size and a relative size of an element may be enlarged for the purpose of clarity and/or description. As such, the size and the relative size of each element are not necessarily limited to those shown in the drawings. In the specification and the accompanying drawings, the same or similar reference numerals indicate the same or similar components.

When an element is described as being "on", "connected to" or "coupled to" another element, the element may be directly on, directly connected to or directly coupled to the another element, or there may be an intermediate element therebetween. However, when an element is described as being "directly on", "directly connected to" or "directly coupled to" another element, there is no intermediate element therebetween. Other terms and/or expressions used to describe a relationship between elements should be interpreted in a similar way, for example, "between . . . " versus "directly between . . . ", "adjacent" versus "directly adjacent" or "on . . . " versus "directly on . . . ", etc. In addition, a term "connection" may refer to a physical connection, an electrical connection, a communication connection and/or a fluid connection. In addition, an X axis, a Y axis and a Z axis are not limited to three axes of a rectangular coordinate system, and may be interpreted in a broader sense. For example, the X axis, the Y axis and the Z axis may be perpendicular to each other, or may represent different directions that are not perpendicular to each other. For the purpose of the present disclosure, "at least one of X, Y and Z" and "at least one selected from a group consisting of X, Y and Z" may be interpreted as only X, only Y, only Z, or any combination of two or more of X, Y and Z such as XYZ, XYY, YZ and ZZ. A term "and/or" as used herein includes any and all combinations of one or more of listed related items.

It should be noted that although terms "first", "second", etc. may be used here to describe various components, members, elements, regions, layers and/or parts, the components, members, elements, regions, layers and/or parts should not be limited by the terms. Rather, the terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teaching of the present disclosure.

For the convenience of descriptions, spatial relational terms such as "up", "down". "left", "right", etc. may be used here to describe a relationship between one element or feature and another element or feature as shown in the drawings. It should be understood that the spatial relational terms are intended to cover different orientations of a device in use or operation other than those described in the drawings. For example, if the device in the drawing is upside down, an element described as "below" or "under" another element or feature may be oriented as "on" or "above" the another element or feature.

Terms "substantially", "approximately", "about", "roughly" and other similar terms used herein are used as approximate terms rather than as terms of degree, and they are intended to explain an inherent deviation of a measured value or calculated value that will be recognized by those skilled in the art. In consideration of factors such as a process fluctuation, a measurement problem and an error (i.e., a limitation of a measurement system) related to a measurement of a particular quantity, "approximately" or "approximately" as used herein includes a stated value and indicates that a particular value determined by those skilled in the art is within an acceptable deviation range. For example, "approximately" may mean that a value is within one or more standard deviations, or within ±30%, ±20%, ±10%, and ±5% of the stated value.

It should be noted that, an expression "the same layer" used herein refers to a layer structure formed by forming a film layer for formation of specific patterns through one and same film forming process, and then performing an one-time patterning process using one and same mask. According to different specific patterns, the one-time patterning process may include a plurality of exposure, development or etching processes. The specific patterns in the formed layer structure may be continuous or discontinuous. That is, a plurality of elements, components, structures and/or parts located in "the same layer" are made of the same material and formed by the same patterning process. Generally, the plurality of elements, components, structures and/or parts located in "the same layer" have approximately the same thickness.

Those skilled in the art should understand that, unless otherwise specified, an expression "height" or "thickness" used herein refers to a size along a surface of each film layer disposed perpendicular to a display substrate, that is, a size in a light emitting direction of the display substrate, or a size in a normal direction of the display device.

Embodiments of the present disclosure at least provide a display substrate. The display substrate includes a display region and a non-display region. The display substrate includes: a base substrate; a plurality of data signal lines, a plurality of first scanning signal lines, a plurality of partition control signal lines, a plurality of first initialization signal lines and a plurality of second scanning signal lines that are disposed on the base substrate. The display substrate includes a plurality of sub-pixels disposed on the base substrate and located in the display region, the plurality of sub-pixels are arranged in an array in a first direction and a second direction in the display region, the first direction intersects the second direction, and at least one of the sub-pixels includes a pixel circuit and a light emitting device. The pixel circuit includes a switch transistor, a first partition control transistor, a drive transistor and a first initialization transistor. The switch transistor is electrically connected to at least one of the first scanning signal lines and at least one of the data signal lines, the first initialization transistor is electrically connected to at least one of the first initialization signal lines and at least one of the second scanning signal lines, the drive transistor is electrically connected to the light emitting device, and the first partition control transistor is electrically connected to the switch transistor, the first initialization transistor, the drive transistor and at least one of the partition control signal lines. The switch transistor is configured to: transmit a data signal on the data signal line to the first partition control transistor in response to a first scanning signal on the first scanning signal line. The first initialization transistor is configured to: transmit a first initialization signal on the first initialization signal line to the first partition control transistor in response to a second scanning signal on the second scanning signal line. The first partition control transistor is configured to: in response to a partition control signal on the partition control signal line, selectively transmit a received first initialization signal to a gate electrode of the drive transistor in an initialization phase and selectively transmit a received data signal to the gate electrode of the drive transistor in a data writing phase. The drive transistor is configured to: provide a drive signal to the light emitting device in response to a voltage difference between the gate electrode of the drive transistor and a first electrode of the drive transistor.

In this way, when the display substrate displays, a part of sub-pixels in the display region AA may adopt a high refresh rate and a part of sub-pixels may adopt a low refresh rate according to actual needs, so that a local high refresh may be realized. In this way, a display effect with a high refresh rate may be realized. At the same time, since the high refresh rate is not required for all sub-pixels, a power consumption may be greatly reduced.

FIG. 1 is a schematic diagram of a display substrate in the related art. As shown in FIG. 1, a display substrate may include a display region AA and a non-display region NA. The display substrate may further include gate drive circuits 11 and a drive chip that are located in the non-display region NA. For example, the gate drive circuits 11 may be located on at least one side of the display region AA. In the embodiment shown in FIG. 1, the gate drive circuits 11 may be located on a left side and a right side of the display region AA, respectively. It should be noted that the left side and the right side may be a left side and a right side of the display substrate (screen) viewed by human eyes during display. For example, the driver chip may be located on at least one side of the display region AA. In the embodiment shown in FIG. 1, the driver chip is located at a lower side of the display region AA. It should be noted that the lower side may be a lower side of the display substrate (screen) viewed by human eyes during display.

The gate drive circuit 11 may be realized by a shift register, and the gate drive circuit 11 may provide a scanning signal to various gate lines (not shown in the drawing) on the display substrate. The drive chip may include a data drive circuit, and the data drive circuit may provide a data signal to various data signal lines (not shown in the drawing) on the display substrate.

It should be noted that although FIG. 1 shows that the gate drive circuits 11 are located on the left side and the right side of the display region AA and the drive chip is located at the lower side of the display region AA, embodiments of the present disclosure are not limited to this, and the gate drive circuits 11 and the drive chip may be located at any appropriate position in the non-display region NA.

For example, the gate drive circuit 11 may use the GOA technology, that is, Gate Driver on Array. In the GOA technology, the gate drive circuit 11 is directly provided on an array substrate to replace an external chip. Each GOA cell is used as a first-level shift register, and each level shift register is connected to a gate line. Scanning signals are sequentially output in turn through shift registers of all levels, so that a progressive scanning of pixel cells may be realized. In some embodiments, the shift register of each level may also be connected to a plurality of gate lines. In this way, a development trend of a high resolution and a narrow frame of the display substrate may be adapted.

With the development of the display technology, a resolution of the display substrate is getting higher and higher, which gradually develops from a resolution of 2K to a resolution of 4K, and even reaches a resolution of 8K at present. The display substrate with the resolution of 8K includes 2160 rows×7680 columns of pixel cells. At the resolution, a full-screen refresh rate of the display substrate may reach 120 HZ. However, compared with the display substrate with a lower resolution such as the resolution of 4K or the resolution of 2K, the number of sub-pixels and signal lines in the display substrate with the resolution of 8K is huge, and a power consumption thereof is greatly increased. At the same time, due to limitations of a data transmission speed and a processing performance, it is difficult for the driver chip to provide support for a higher full-screen refresh rate of the display substrate with such a huge number of pixel cells, which seriously restricts a further improvement of the refresh rate.

In view of this, some embodiments of the present disclosure provide a display substrate. The display substrate may reduce the power consumption on the basis of realizing the high refresh rate (e.g., 240 HZ and above). For example, the display substrate may be an array substrate for an OLED display panel.

Figure 2:
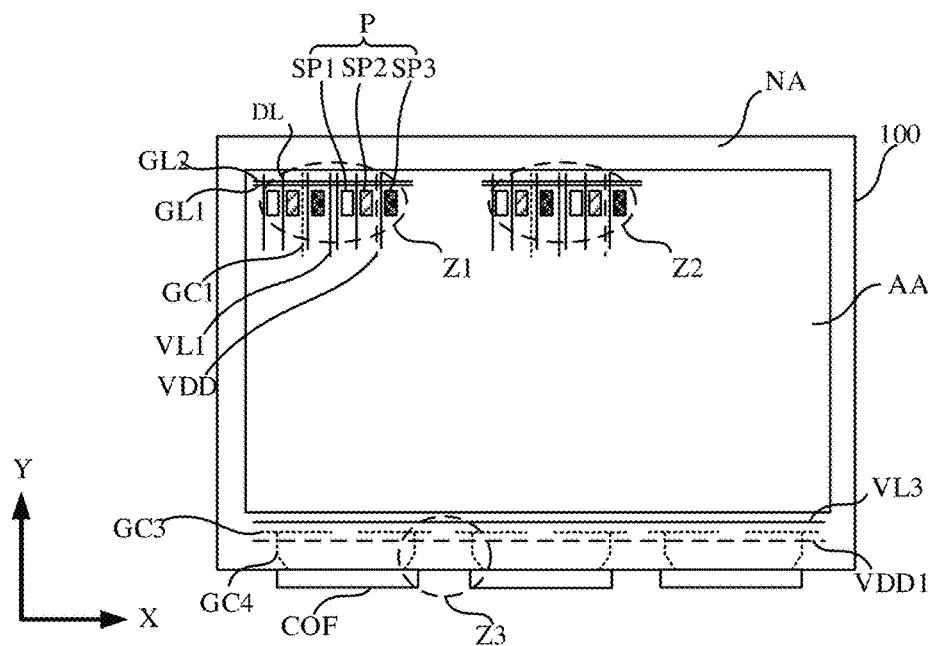
FIG. 2 is a schematic plan view of a display substrate according to some embodiments of the present disclosure.

FIG. 2 is a schematic plan view of a display substrate according to some embodiments of the present disclosure. It should be noted that some other signal lines included in the display substrate are omitted in FIG. 2 in order to clearly show relative positional relationships between sub-pixels and data signal lines, first scanning signal lines, partition control signal lines, first initialization signal lines and second scanning signal lines. Also, in the display region AA in FIG. 2, only two pixel cells P at a position Z1 and two pixel cells P at a position Z2, and the data signal lines, the first scanning signal lines, the partition control signal lines, the first initialization signal lines and the second scanning signal lines electrically connected to the pixel cells are shown. In the non-display region NA in FIG. 2, only leads of the partition control signal lines, the first power lines and the first initialization signal lines are shown.

It should also be noted that FIG. 2 exemplarily shows that a shape of an orthographic projection of the sub-pixel on the base substrate is a rectangle. However, embodiments of the present disclosure are not limited to this. For example, the orthographic projection of the sub-pixel on the base substrate may also have other shapes such as a pentagon, a hexagon, a circle, etc. Moreover, an arrangement of three sub-pixels in a pixel cell is not limited to the arrangement shown in FIG. 2.

Figure 3:
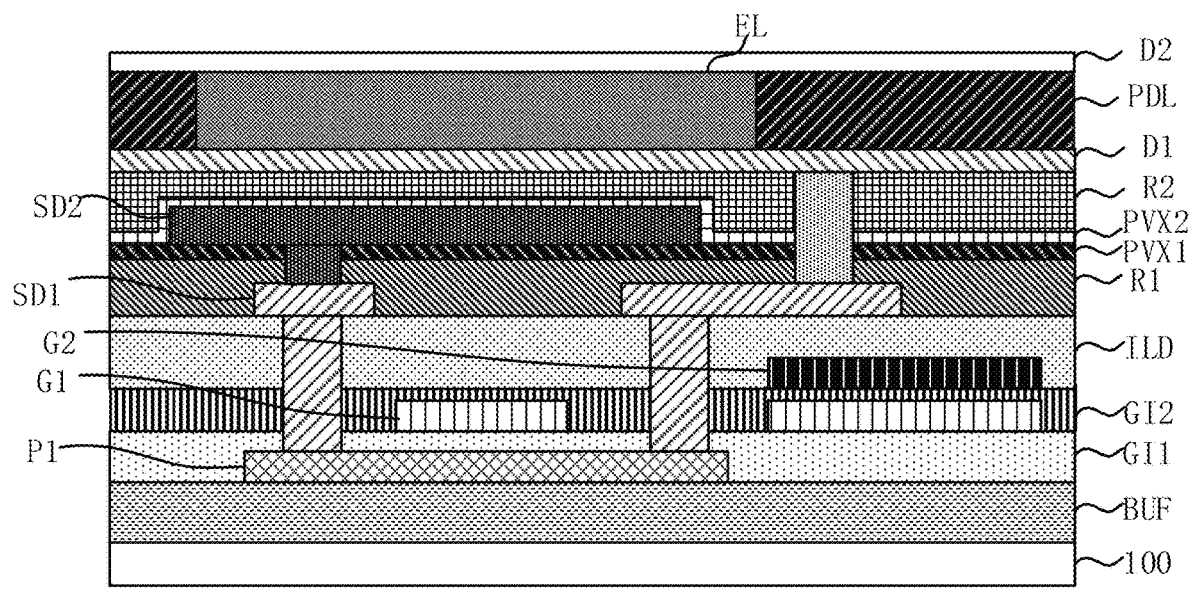
FIG. 3 is a schematic diagram of a film layer stack of a display substrate according to some embodiments of the present disclosure.

FIG. 3 is a schematic diagram of a film layer stack of a display substrate according to some embodiments of the present disclosure. As shown in FIG. 2 and FIG. 3, the display substrate may include the display region AA and the non-display region NA at least partially surrounding the display region AA, and the display substrate further includes a base substrate 1 and a plurality of pixel cells P disposed on the base substrate 1 and located in the display region AA. Each pixel cell P may include a plurality of sub-pixels. For example, each pixel cell P includes a first sub-pixel SP1, a second sub-pixel SP2 and a third sub-pixel SP3. In order to facilitate understanding, the first sub-pixel SP1, the second sub-pixel SP2 and the third sub-pixel SP3 may be described as a red sub-pixel, a green sub-pixel and a blue sub-pixel, respectively. However, embodiments of the present disclosure are not limited to this The plurality of sub-pixels are arranged in an array on a base substrate 100 in a first direction X and a second direction Y. The first direction intersects the second direction. For example, the first direction X is a horizontal direction in FIG. 2, and the second direction Y is a vertical direction in FIG. 2. That is, the first direction X and the second direction Y are perpendicular to each other. It should be noted that although the first direction X and the second direction Y are perpendicular to each other in the embodiment shown in FIG. 2, embodiments of the present disclosure are not limited to this.

Figure 4:
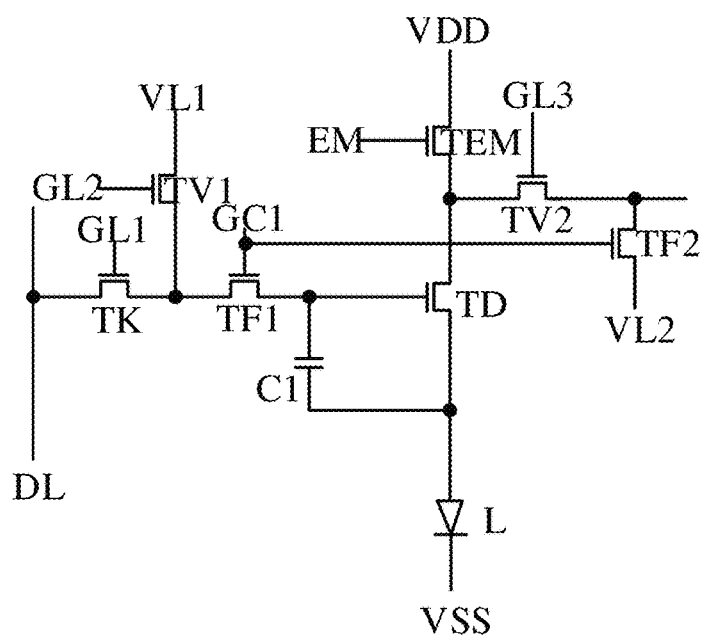
FIG. 4 is a schematic diagram of an equivalent circuit of a pixel circuit according to embodiments of the present disclosure.

At least one of the sub-pixels includes a pixel circuit and a light emitting device. For example, the light emitting device may be an OLED light emitting device, which includes an anode, an organic light emitting layer, and a cathode arranged in a stack. The pixel circuit may include a plurality of thin film transistors. FIG. 4 is a schematic diagram of an equivalent circuit of a pixel circuit according to embodiments of the present disclosure. As shown in FIG. 4, the pixel circuit includes a switch transistor TK, a first partition control transistor TF1, a drive transistor TD and a first initialization transistor TV1.

As shown in FIG. 2 to FIG. 4, the display substrate may include a plurality of data signal lines DL, a plurality of first scanning signal lines GL1, a plurality of partition control signal lines GC1, a plurality of first initialization signal lines VL1 and a plurality of second scanning signal lines GL2 that are disposed on the base substrate 100. In the embodiment shown in FIG. 2, each sub-pixel is electrically connected to the data signal line DL located on a left side of the sub-pixel.

In one and same same pixel circuit, the switch transistor TK is electrically connected to at least one of the first scanning signal lines GL1 and at least one of the data signal lines DL, the first initialization transistor TV1 is electrically connected to at least one of the first initialization signal lines VL1 and at least one of the second scanning signal lines GL2, the drive transistor TD is electrically connected to the light emitting device L, and the first partition control transistor TF1 is electrically connected to the switch transistor TK, the first initialization transistor TV1, the drive transistor TD and at least one of the partition control signal lines GC1.

The switch transistor TK is configured to: transmit a data signal on the data signal line DL to the first partition control transistor TF1 in response to a first scanning signal on the first scanning signal line GL1. The first initialization transistor TV1 is configured to: transmit a first initialization signal on the first initialization signal line VL1 to the first partition control transistor TF1 in response to a second scanning signal on the second scanning signal line GL2. The first partition control transistor TF1 is configured to: in response to a partition control signal on the partition control signal line GC1, selectively transmit a received first initialization signal to a gate electrode of the drive transistor TD in an initialization phase and selectively transmit a received data signal to the gate electrode of the drive transistor TD in a data writing phase. The drive transistor TD is configured to: provide a drive signal to the light emitting device L in response to a voltage difference between the gate electrode of the drive transistor TD and a first electrode of the drive transistor TD.

For example, a gate electrode of the switch transistor TK is electrically connected to the first scanning signal line GL1, a first electrode of the switch transistor is electrically connected to the data signal line DL, a gate electrode of the first initialization transistor TV1 is electrically connected to the second scanning signal line GL2, a first electrode of the first initialization transistor TV1 is electrically connected to the first initialization signal line VL1, a second electrode of the drive transistor TD is electrically connected to the light emitting device L, a first electrode of the first partition control transistor TF1 is electrically connected to a second electrode of the switch transistor TK and a second electrode of the first initialization transistor TV1, a second electrode of the first partition control transistor TF1 is electrically connected to the gate electrode of the drive transistor TD, and a gate electrode of the first partition control transistor TF1 is electrically connected to the partition control signal line GC1 of the drive transistor TD.

Figure 5:
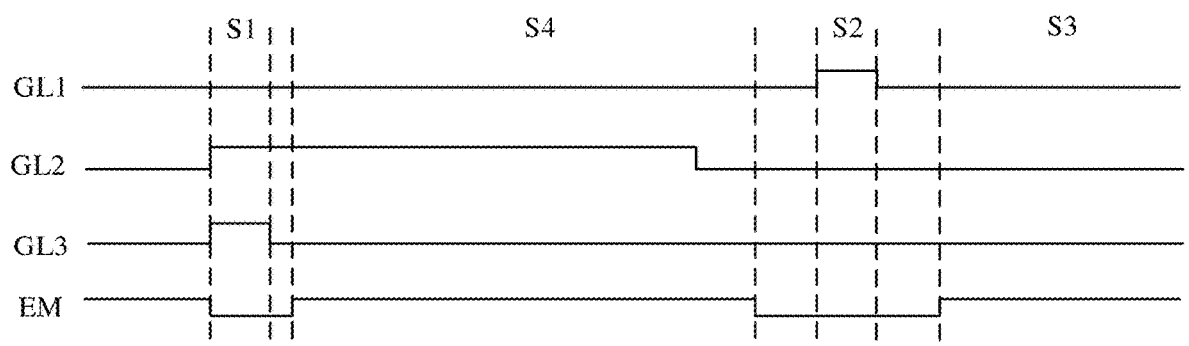
FIG. 5 is a drive timing diagram of a pixel circuit according to embodiments of the present disclosure.

FIG. 5 is a drive timing diagram of a pixel circuit according to embodiments of the present disclosure. As shown in FIG. 4 and FIG. 5, a frame period may include an initialization phase S1, a data writing phase S2 and a light emitting phase S3. For a sub-pixel SP, in the initialization phase S1, a potential reset may be performed on a key node in the pixel circuit of the sub-pixel SP. For example, the potential reset may be performed on the gate electrode of the drive transistor TD. In the data writing phase S2, the data signal on the data signal line DL may be written into the pixel circuit. For example, the data signal on the data signal line DL may be transmitted to the gate electrode of the drive transistor TD. In the light emitting phase S3, the pixel circuit may drive the light emitting device to emit light according to a written data signal. For example, the drive transistor TD provides a drive current to the light emitting device L in response to the voltage difference between the gate electrode of the drive transistor TD and the first electrode of the drive transistor TD, so as to drive the light emitting device L to emit light.

In embodiments of the present disclosure, in the initialization phase S1, the first partition control transistor TF1 selectively transmits the received first initialization signal to the gate electrode of the drive transistor TD. Specifically, in the initialization phase S1, the first partition control transistor TF1 selectively transmits the first initialization signal to the gate electrode of the drive transistor TD or selectively not transmit the first initialization signal to the gate electrode of the drive transistor TD according to whether the received partition control signal is an effective level signal or not.

For example, in the initialization phase S1, for the sub-pixel at the position Z1 in the display region, when the partition control signal received by the first partition control transistor TF1 in the pixel circuit of the sub-pixel is an effective level signal, the first partition control transistor TF1 in the pixel circuit is turned on, that is, the first partition control transistor TF1 selectively transmits the received first initialization signal to the gate electrode of the drive transistor TD. For the sub-pixel at the position Z2 in the display region, when the partition control signal received by the first partition control transistor TF1 in the pixel circuit of the sub-pixel is a non-effective level signal, the first partition control transistor TF1 in the pixel circuit is turned off, that is, the first partition control transistor TF1 selectively not transmit the received first initialization signal to the gate electrode of the drive transistor TD.

Accordingly, in the data writing phase, the first partition control transistor TF1 selectively transmits the received data signal to the gate electrode of the drive transistor TD. Specifically, in the data writing phase, the first partition control transistor TF1 selectively transmit the data signal to the gate electrode of the drive transistor TD or selectively not transmit the data signal to the gate electrode of the drive transistor TD according to whether the received partition control signal is an effective level signal or not.

For example, in the data writing phase S2, for the sub-pixel at the position Z1 in the display region, when the partition control signal received by the first partition control transistor TF1 in the pixel circuit of the sub-pixel is an effective level signal, the first partition control transistor TF1 in the pixel circuit is turned on, that is, the first partition control transistor TF1 selectively transmits the received data signal to the gate electrode of the drive transistor TD. For the sub-pixel at the position Z2 in the display region, when the partition control signal received by the first partition control transistor TF1 in the pixel circuit of the sub-pixel is an non-effective level signal, the first partition control transistor TF1 in the pixel circuit is turned off, that is, the first partition control transistor TF1 selectively not transmit the received data signal to the gate electrode of the drive transistor TD.

In this way, in a frame period, for a sub-pixel in the display region, whether the first initialization signal and the data signal are written into the gate electrode of the drive transistor TD of the sub-pixel or not may be controlled by controlling turn-on or turn-off of the first partition control transistor TF1 of the sub-pixel, so as to control the refresh rate of the sub-pixel. For example, in a frame period, the first partition control transistor TF1 of the sub-pixel at the position Z1 is turned on, so that the first initialization signal and the data signal are written into the gate electrode of the drive transistor TD of the sub-pixel. The first partition control transistor TF1 of the sub-pixel at the position Z2 is turned off, so that the first initialization signal and the data signal are not written into the gate electrode of the drive transistor TD of the sub-pixel. At this time, the sub-pixel at the position Z1 may emit light in response to a newly written data signal, while the sub-pixel at the position Z2 may emit light in response to the data signal written in the previous frame period. Therefore, the sub-pixel at the position Z1 has a higher refresh rate, while the sub-pixel at the position Z2 has a lower refresh rate.

When the display substrate displays, sub-pixels in a part of the display region AA may use a higher refresh rate and sub-pixels in another part of the display region AA may use a lower refresh rate according to actual needs, so that a local high refresh may be realized.

Figure 6:
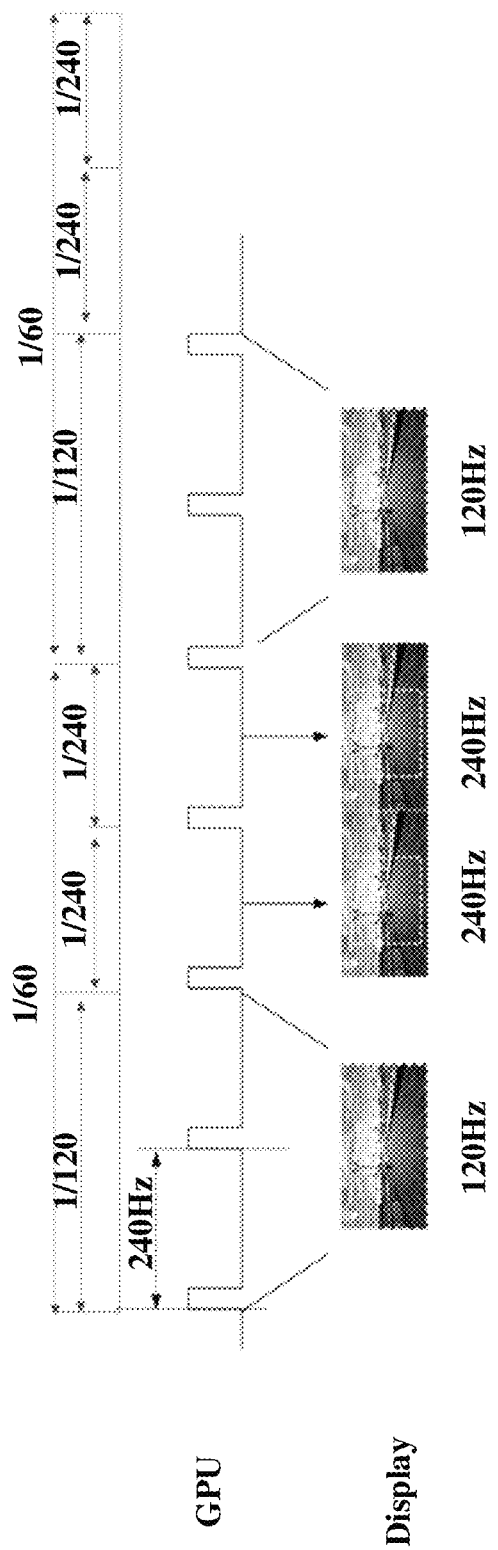
FIG. 6 is a schematic diagram of displaying an image driven by an image processing chip according to embodiments of the present disclosure.

FIG. 6 is a schematic diagram of displaying an image driven by an image processing chip according to embodiments of the present disclosure. As shown in FIG. 6, an image processing chip GPU may output a signal at 240 HZ. In each frame period, when the first partition control transistor TF1 is always turned on, the sub-pixel may reach a refresh rate of 240 HZ, and when the first partition control transistor TF1 is turned on once every other frame period, the sub-pixel may reach a refresh rate of 120 HZ, and so on, the sub-pixel may also reach a resolution of 60 HZ.

Optionally, a higher refresh rate may be used for a region watched by a user in the display region, and a lower refresh rate may be used for other regions. In this way, for a display substrate with a high resolution, even if a full-screen high refresh may not be realized for reasons such as a performance of the drive chip, etc., the display effect with the high refresh rate may also be realized through a local high refresh in embodiments of the present disclosure. At the same time, compared with a solution that all the display regions use the high refresh rate, the use of local high refresh may greatly reduce the power consumption.

The pixel circuit according to embodiments of the present disclosure will be further described below first with reference to the accompanying drawings.

Figure 7:
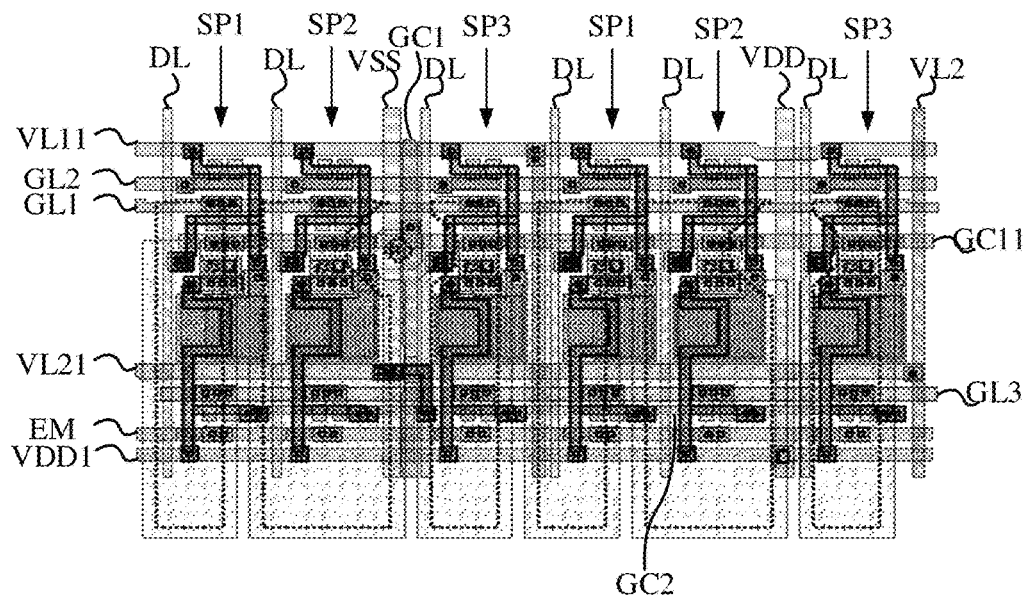
FIG. 7 schematically shows a schematic plan view of two pixel cells adjacent in a first direction according to embodiments of the present disclosure.

FIG. 7 schematically shows a schematic plan view of two pixel cells adjacent in a first direction according to embodiments of the present disclosure. As shown in FIG. 2 to FIG. 7. in some specific embodiments, the display substrate further includes a plurality of light emitting control signal lines EM and a plurality of first power lines VDD that are disposed on the base substrate. The pixel circuit further includes a light emitting control transistor TEM, and the light emitting control transistor TEM is electrically connected to the drive transistor TD, at least one of the light emitting control signal lines EM and at least one of the first power lines VDD. The light emitting control transistor TEM is configured to: transmit a first voltage signal on the first power line VDD to the first electrode of the drive transistor TD in response to a light emitting control signal on the light emitting control signal line EM.

For example, a first electrode of the light emitting control transistor TEM is electrically connected to the first power line VDD, a second electrode of the light emitting control transistor TEM is electrically connected to the first electrode of the drive transistor TD, and a gate electrode of the light emitting control transistor TEM is electrically connected to the light emitting control signal line EM.

In some specific embodiments, the display substrate further includes a plurality of second partition control transistors TF2 and a plurality of second initialization signal lines VL2 that are disposed on the base substrate 100, and at least one of the second partition control transistors TF2 is electrically connected to at least one of the partition control signal lines GC1, at least one of the second initialization signal lines VL2 and the pixel circuits in the plurality of sub-pixels. The at least one of the second partition control transistors TF2 is configured to: in response to a partition control signal on the partition control signal line GC1, selectively transmit a second initialization signal on the second initialization signal line VL2 to the pixel circuit electrically connected to the second partition control transistor TF2.

For example, a first electrode of the second partition control transistor TF2 is electrically connected to the second initialization signal line VL2, a second electrode of the second partition control transistor TF2 is electrically connected to the pixel circuits of a plurality of sub-pixels arranged in the first direction, and a gate electrode of the second partition control transistor TF2 is electrically connected to the partition control signal line GC1.

The second partition control transistor TF2 selectively transmits a received second initialization signal on the second initialization signal line VL2 to the pixel circuit electrically connected to the second partition control transistor TF2. Specifically, in the initialization phase S1, the second partition control transistor TF2 selectively transmits the second initialization signal to the gate electrode of the drive transistor TD or selectively not transmit the second initialization signal to the gate electrode of the drive transistor TD according to whether the received partition control signal is an effective level signal or not.

For example, in the initialization phase S1, for the pixel circuits of the plurality of sub-pixels at the position Z1 in the display region, when the partition control signal received by the second partition control transistor TF2 electrically connected to the plurality of pixel circuits is an effective level signal, the second partition control transistor TF2 is turned on, that is, the second partition control transistor TF2 selectively transmits the received second initialization signal to the plurality of pixel circuits at the position Z1. For the pixel circuits of the plurality of sub-pixels at the position Z2 in the display region, when the partition control signal received by the second partition control transistor TF2 electrically connected to the plurality of pixel circuits is an non-effective level signal, the second partition control transistor TF2 is turned off, that is, the second partition control transistor TF2 selectively no transmit the received second initialization signal to the plurality of pixel circuits at Z4.

The second initialization signal may be an electrical signal for initializing the first electrode and the second electrode of the drive transistor TD in the pixel circuit, and whether the second initialization signal is transmitted to the pixel circuit electrically connected to the second partition control transistor TF2 or not may be controlled by the second partition control transistor TF2. For example, for a pixel circuit of a sub-pixel requiring a high refresh rate, the second partition control transistor TF2 electrically connected to the pixel circuit may be turned on, so that the second initialization signal is transmitted to the pixel circuit. For a pixel circuit of a sub-pixel without requiring a high refresh rate, the second partition control transistor TF2 electrically connected to the pixel circuit may be turned off. At this time, the second initialization signal may not be transmitted to the pixel circuit.

In some specific embodiments, the display substrate further includes a plurality of third scanning signal lines GL3 disposed on the base substrate 100. The pixel circuit further includes a second initialization transistor TV2, the pixel circuit is electrically connected to the second partition control transistor TF2 through the second initialization transistor TV2, and the second initialization transistor TV2 is further electrically connected to the drive transistor TD and at least one of the third scanning signal lines GL3. The second initialization transistor TV2 is configured to: transmit a received second initialization signal to the first electrode of the drive transistor TD in response to a third scanning signal on the third scanning signal line GL3.

For example, a first electrode of the second initialization transistor TV2 is electrically connected to the second electrode of the second partition control transistor TF2, a second electrode of the second initialization transistor TV2 is electrically connected to the first electrode of the drive transistor TD, and a gate electrode of the second initialization transistor TV2 is electrically connected to the third scanning signal line GL3.

In the initialization phase S1 in a frame period, the second initialization transistor TV2 may be turned on. In this way, when the second partition control transistor TF2 electrically connected to the second initialization transistor TV2 is also turned on, the second initialization signal may be transmitted to the first electrode and the second electrode of the drive transistor TD, thereby initializing the first electrode and the second electrode and preparing for writing a new data signal. When the second partition control transistor TF2 electrically connected to the second initialization transistor TV2 is turned off, the second initialization signal may not be transmitted to the first electrode and the second electrode of the drive transistor TD, and the drive transistor TD may continue to drive the light emitting device L to emit light based on the data signal received in the previous frame period.

Taking the sub-pixel at the position Z1 and the sub-pixel at the position Z2 as an example to describe a working process of the pixel circuit capable of realizing the local high refresh in embodiments of the present disclosure. The sub-pixel at the position Z1 uses a higher refresh rate, while the sub-pixel at the position Z2 uses a lower refresh rate. Planar structures of the sub-pixel at the position Z1 and relevant signal lines of the sub-pixel and planar structures of the sub-pixel at the position Z2 and relevant signal lines of the sub-pixel may be shown in FIG. 7.

In a first frame period, the effective level signal is provided to the partition control signal line GC1 electrically connected to the pixel circuit of the sub-pixel at the position Z1, so that the second partition control transistor TF2 is kept on in the first frame period. The effective level signal is provided to the partition control signal line GC1 electrically connected to the pixel circuit of the sub-pixel at the position Z2, so that the second partition control transistor TF2 is also kept on in the first frame period.

In the initialization phase S1, the effective level signal is provided to the second scanning signal line and the third scanning signal line GL3, and the non-effective signal is provided to the first scanning signal line GL1 and the light emitting control signal line EM. At this time, for any one of the pixel circuit of the sub-pixel at the position Z1 and the pixel circuit of the sub-pixel at the position Z2, the first initialization transistor and the second initialization transistor TV2 are turned on, the first initialization signal is transmitted to the gate electrode of the drive transistor TD, and the second initialization signal is transmitted to the first electrode and the second electrode of the drive transistor TD.

Between the initialization phase S1 and the data writing phase S2, the non-effective level signal is provided to the third scanning signal line GL3, and the effective level signal is provided to the light emitting control signal line EM. At this time, for any one of the pixel circuit of the sub-pixel at the position Z1 and the pixel circuit of the sub-pixel at the position Z2, the second initialization transistor TV2 is turned off, the light emitting control transistor TEM is turned on, and the second electrode of the drive transistor TD starts to be charged until a voltage value thereof reaches Vref−Vth, and then the drive transistor TD is turned off, so that a threshold voltage compensation is completed.

In the data writing phase S2, the non-effective level signal is provided to the second scanning signal line GL2 and the light emitting control signal line EM, and the effective level signal is provided to the first scanning signal line GL1. At this time, for any one of the pixel circuit of the sub-pixel at the position Z1 and the pixel circuit of the sub-pixel at the position Z2. the first initialization transistor and the light emitting control transistor TEM are turned off, the switch transistor is turned on, and the data signal is transmitted to the gate electrode of the drive transistor TD.

In the light emitting phase S3, the effective level signal is provided to the light emitting control signal line EM, and the non-effective level signal is provided to the first scanning signal line GL1. At this time, for any one of the pixel circuit of the sub-pixel at the position Z1 and the pixel circuit of the sub-pixel at the position Z2, the light emitting control transistor TEM is turned on, the switch transistor is turned off, and the drive transistor TD provides a drive current to the light emitting device L according to the voltage difference between the gate electrode of the drive transistor TD and the first electrode the drive transistor TD, so as to drive the light emitting device L to emit light.

In a second frame period, the effective level signal is provided to the partition control signal line GC1 electrically connected to the pixel circuit of the sub-pixel at the position Z1, so that the second partition control transistor TF2 is kept on in the second frame period. The non-effective level signal is provided to the partition control signal line GC1 electrically connected to the pixel circuit of the sub-pixel at the position Z2 throughout the second frame period, so that the second partition control transistor TF2 is turned off in the second frame period.

For the pixel circuit of the sub-pixel at the position Z1, the pixel circuit of the sub-pixel may repeat the above-mentioned process, and drive the light emitting device L to emit light based on a newly written data signal. For the pixel circuit of the sub-pixel at the position Z2. the first partition control transistor TF1 in the pixel circuit and the second partition control transistor TF2 electrically connected to the pixel circuit may be turned off. Therefore, and the pixel circuit of the sub-pixel may drive the light emitting device L to emit light based on the data signal written in the previous frame period.

In this way, a refresh rate of the sub-pixel at the position Z1 may be higher than a refresh rate of the sub-pixel at the position Z2, so that the local high refresh may be realized.

Next, a specific structure of one of the pixel circuits in embodiments of the present disclosure will be described. It should be noted that, unless otherwise specified, transistors described below are transistors in one and same pixel circuit, and signal lines also refer to signal lines electrically connected to the pixel circuit.

Figure 8:
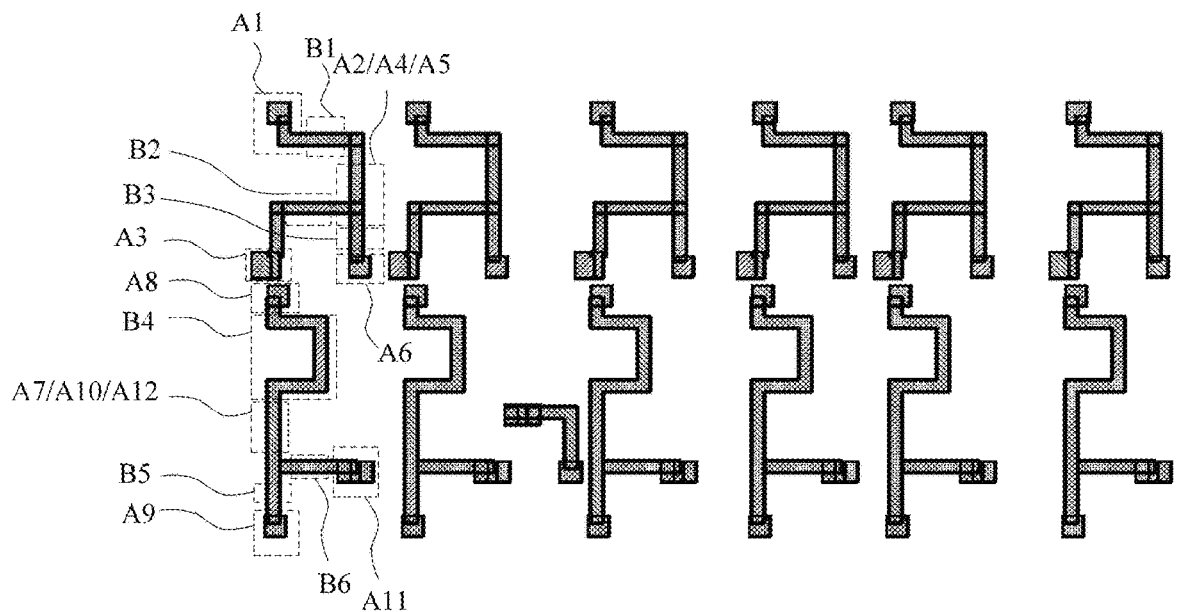
FIG. 8 to FIG. 18 are schematic plan views of various film layers in FIG. 7, in which FIG. 8 schematically shows a schematic plan view of a semiconductor layer, FIG. 9 schematically shows a schematic plan view of a first gate layer, FIG. 10 schematically shows a schematic plan view of a second gate layer, FIG. 11 schematically shows a schematic plan view of an interlayer dielectric layer, FIG. 12 schematically shows a schematic plan view of a first metal conductive layer, FIG. 13 schematically shows a schematic plan view of a first insulating layer, FIG. 14 schematically shows a schematic plan view of a first passivation layer, FIG. 15 schematically shows a schematic plan view of a second metal conductive layer, FIG. 16 schematically shows a schematic plan view of a second passivation layer, FIG. 17 schematically shows a schematic plan view of a second insulating layer, and FIG. 18 schematically shows a schematic plan view of a first electrode layer.
Figure 9:
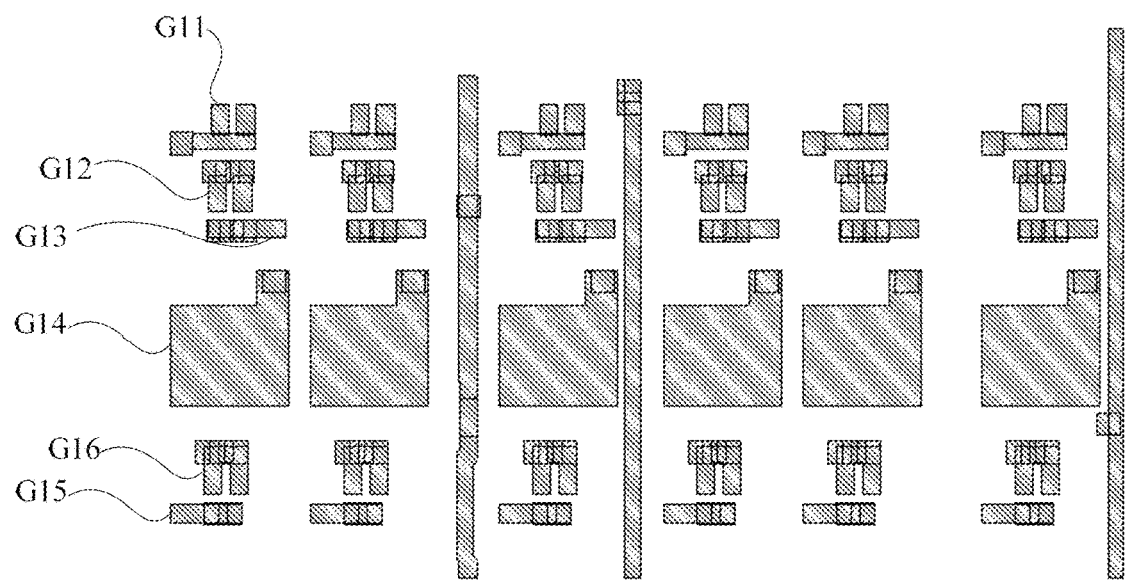
Figure 10:
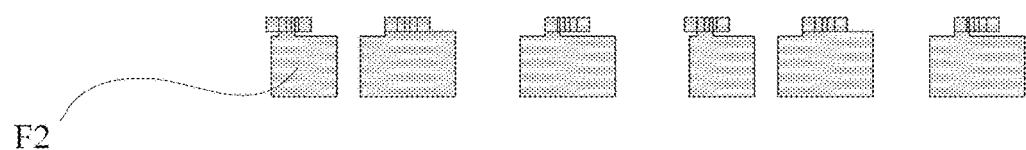
Figure 11:
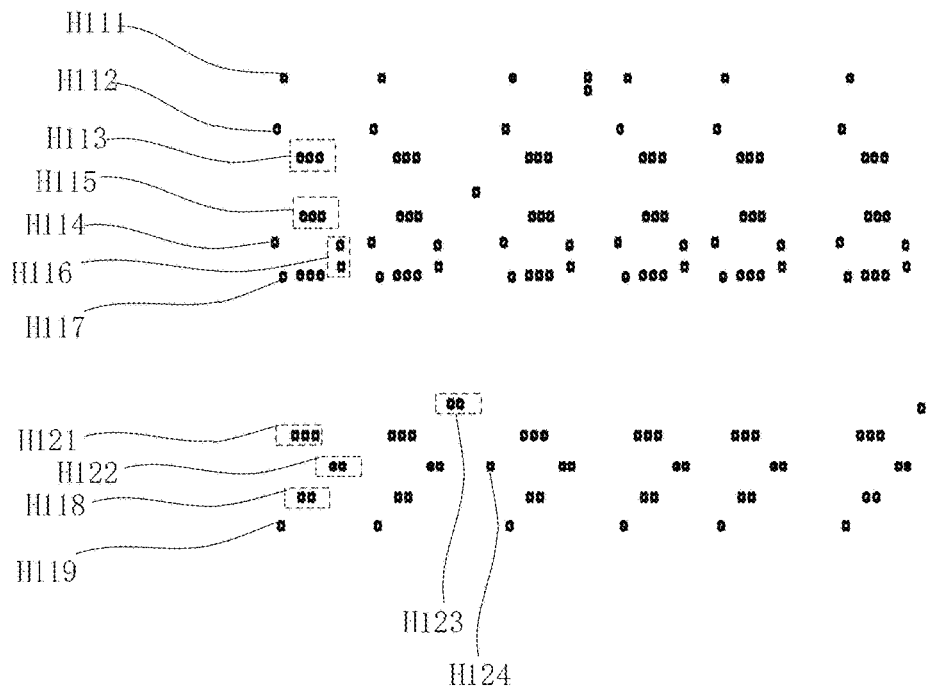
Figure 12:
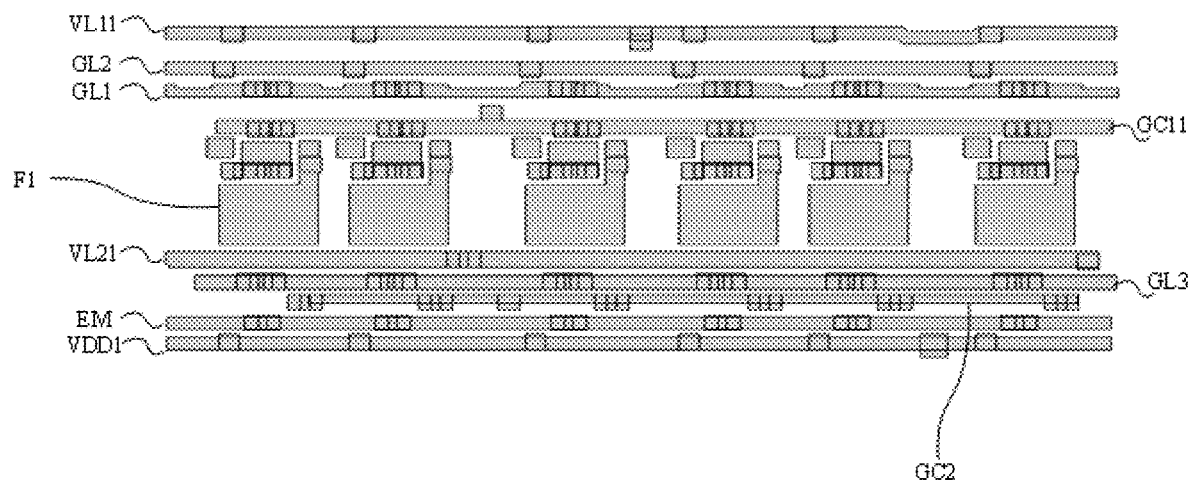
Figure 13:
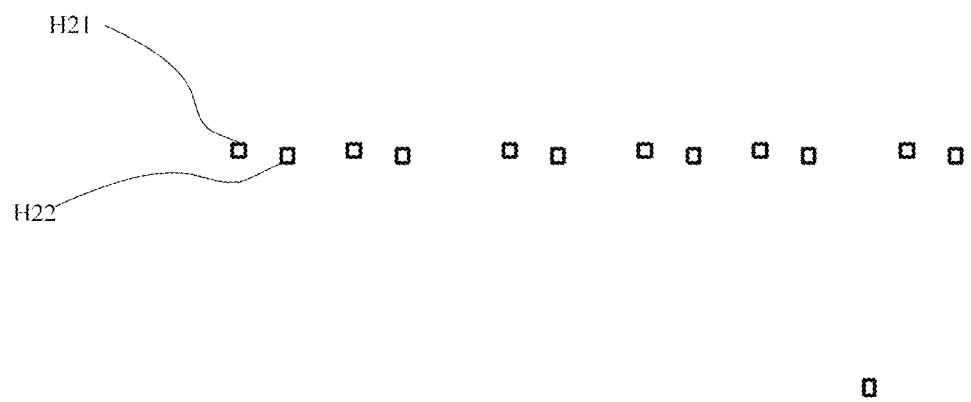
Figure 14:
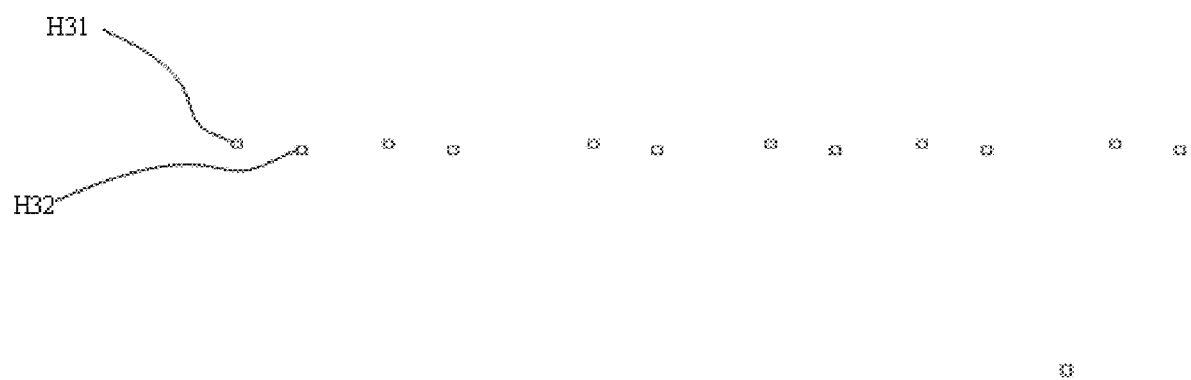
Figure 15:
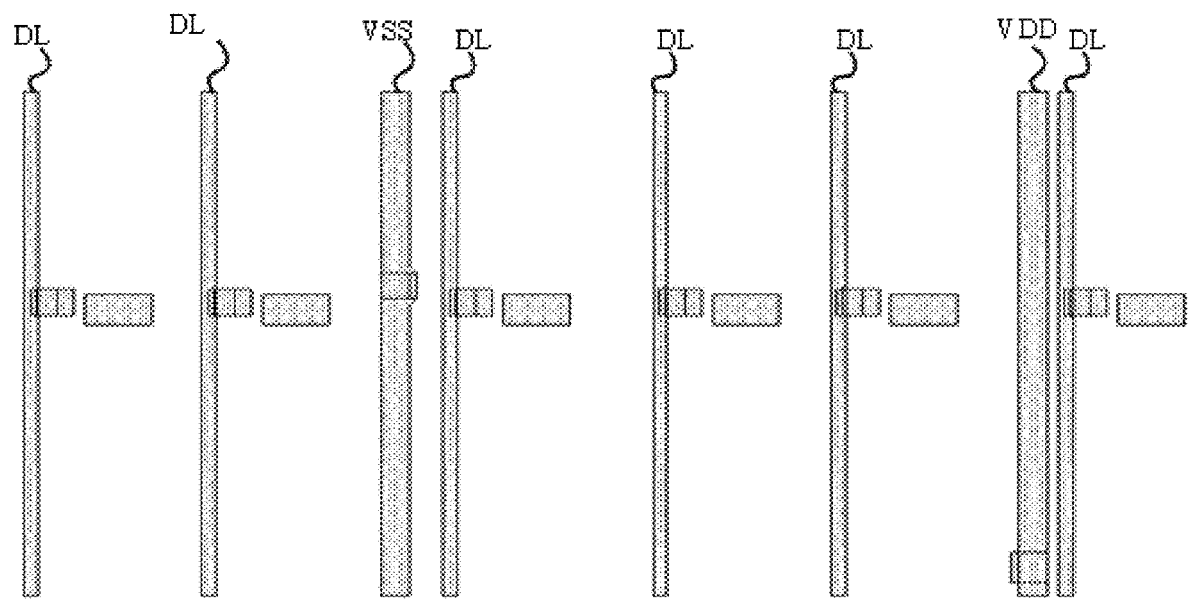
Figure 16:
Figure 17:
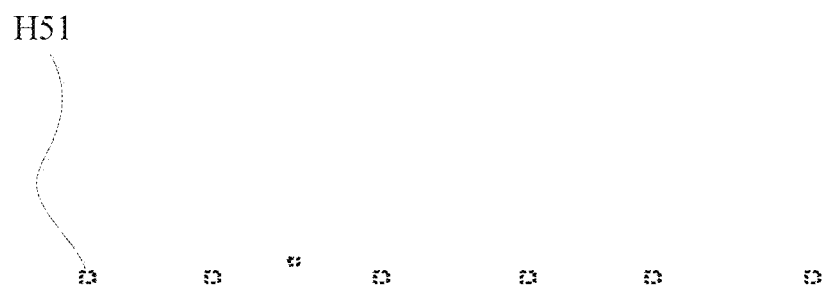
Figure 18:
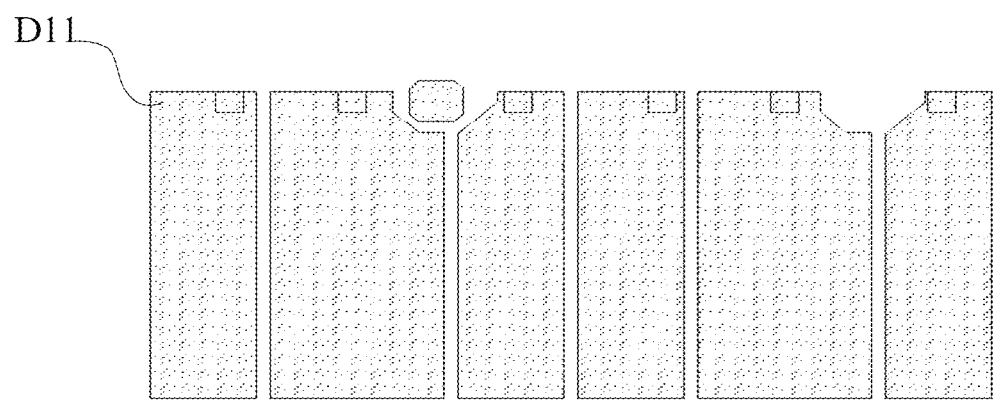

FIG. 8 to FIG. 18 are schematic plan views of various film layers in FIG. 7, in which FIG. 8 schematically shows a schematic plan view of a semiconductor layer, FIG. 9 schematically shows a schematic plan view of a first gate layer, FIG. 10 schematically shows a schematic plan view of a second gate layer, FIG. 11 schematically shows a schematic plan view of an interlayer dielectric layer, FIG. 12 schematically shows a schematic plan view of a first metal conductive layer, FIG. 13 schematically shows a schematic plan view of a first insulating layer, FIG. 14 schematically shows a schematic plan view of a first passivation layer, FIG. 15 schematically shows a schematic plan view of a second metal conductive layer, FIG. 16 schematically shows a schematic plan view of a second passivation layer, FIG. 17 schematically shows a schematic plan view of a second insulating layer, and FIG. 18 schematically shows a schematic plan view of a first electrode layer.

As shown in FIG. 7 to FIG. 18, in some specific embodiments, the display substrate includes: a semiconductor layer P1 disposed on a base substrate 100, a first gate layer G1 disposed on a side of the semiconductor layer P1 away from the base substrate 100, a second gate layer G2 disposed on a side of the first gate layer G1 away from the base substrate 100, a first metal conductive layer SD1 disposed on a side of the second gate layer G2 away from the base substrate 100, a second metal conductive layer SD2 disposed on a side of the first metal conductive layer SD1 away from the base substrate 100, and a first electrode layer D1 disposed on a side of the second metal conductive layer SD2 away from the base substrate 100.

The display substrate further includes insulating film layers disposed between various conductive film layers, such as an interlayer dielectric layer ILD disposed between the second gate layer G2 and the first metal conductive layer SD1, a first insulating layer R1 disposed between the first metal conductive layer SD1 and the first metal conductive layer SD1, a first passivation layer PVX1 disposed between the first insulating layer R1 and the second metal conductive layer SD2, a second passivation layer PVX2 disposed between the second metal conductive layer SD2 and the first electrode layer D1, and a second insulating layer R2 disposed between second passivation layer PVX2 and the first electrode layer D1.

In some specific embodiments, in one and same pixel circuit, in the second direction, an orthographic projection of the first partition control transistor TF1 on the base substrate 100 is located between an orthographic projection of the first initialization transistor TV1 on the base substrate 100 and an orthographic projection of the drive transistor TD on the base substrate 100.

For example, in one and same pixel circuit, the first initialization transistor TV1 is located above the first partition control transistor TF1, and the drive transistor TD is located below the first partition control transistor TF1.

The first initialization transistor TV1 includes a first connecting region A1 (which is also referred to as a first electrode connecting region of the first initialization transistor), a second connecting region A2 (which is also referred to as a second electrode connecting region of the first initialization transistor) and a first channel region B1 located between the first connecting region A1 and the second connecting region A2 in the semiconductor layer P1. The first initialization transistor TV1 further includes a first gate electrode G11 located in the first gate layer G1. The first gate electrode G11 may include a first gate portion and a second gate portion arranged in the first direction, and the first channel region B1 of the first initialization transistor is disposed opposite to the first gate portion and the second gate portion.

The first initialization signal line VL1 extends in the second direction, and the first initialization signal line VL1 may be shared by a plurality of pixel circuits arranged in the first direction. Specifically, the first initialization signal line VL1 may be electrically connected to the first electrode of the first initialization transistor of each of the plurality of pixel circuits through a first initialization connecting line VL11 extending in the first direction.

The first initialization connecting line VL11 is located in the first metal conductive layer SD1. For at least one pixel circuit, the first connecting region A1 of the first initialization transistor is electrically connected to the first initialization connecting line VL11 through a via hole H111 penetrating the interlayer dielectric layer ILD, and the second connecting region A2 of the first initialization transistor is electrically connected to the switch transistor TK and the first partition control transistor TF1.

The second scanning line GL2 extends in the first direction. In the second direction, an orthographic projection of the first gate electrode G11 on the base substrate 100 is located between an orthographic projection of the first initialization connecting line VL11 on the base substrate 100 and an orthographic projection of the second scanning line GL2 on the base substrate 100.

The second scanning line GL2 is located in the first metal conductive layer SD1. For at least one pixel circuit, the first gate electrode G11 of the first initialization transistor in the pixel circuit is electrically connected to the second scanning line GL2 through a via hole H112 penetrating the interlayer dielectric layer ILD.

The orthographic projection of the first initialization connecting line VL11 on the base substrate 100 is located on a side of the orthographic projection of the second scanning line GL2 on the base substrate 100 close to the pixel circuits of the previous row.

In some specific embodiments, in one and same pixel circuit, the orthographic projection of the first partition control transistor TF1 on the base substrate 100 and an orthographic projection of the switch transistor TK on the base substrate 100 are arranged in the first direction X.

The first scanning line GL1 extends in the first direction X, and an orthographic projection of the first scanning line GL1 on the base substrate 100 is located on a side of the orthographic projection of the second scanning line GL2 on the base substrate 100 away from the orthographic projection of the first initialization connecting line VL11 on the base substrate 100.

The switch transistor TK includes a third connecting region A3, a fourth connecting region A4, and a second channel region B2 located between the third connecting region A3 and the fourth connecting region A4 in the semiconductor layer P1. The switch transistor TK further includes a second gate electrode G12 located in the first gate layer G1, and the second gate electrode G12 may include a third gate portion and a fourth gate portion arranged in the first direction X. The second channel region B2 is disposed opposite to the third gate portion and the fourth gate portion.

An orthographic projection of the second gate electrode on the base substrate 100 is located on a side of the orthographic projection of the first scanning line GL1 on the base substrate 100 away from the orthographic projection of the first initialization connecting line VL11 on the base substrate 100.

The data signal line DL is located in the second metal conductive layer, and the first scanning line GL1 is located in the first metal conductive layer SD1. The gate electrode of the switch transistor TK is electrically connected to the first scanning line GL1 through a via hole H113 penetrating the interlayer dielectric layer ILD, the third connecting region of the switch transistor TK is electrically connected to the data signal line DL through a via hole H114 penetrating the interlayer dielectric layer ILD, a via hole H21 penetrating the first insulating layer R1 and a via hole H31 penetrating the first passivation layer PVX1, and the fourth connecting region A4 of the switch transistor TK is electrically connected to the second connecting region A2 of the first initialization transistor TV1.

The partition control signal line GC1 extends in the second direction Y, and the partition control signal line GC1 may be shared by a plurality of pixel circuits arranged in the first direction X. For example, the partition control signal line GC1 may be electrically connected to the gate electrode of the first partition control transistor TF1 of each of the plurality of pixel circuits through a first partition control connecting line GC11 extending in the first direction X.

The first partition control transistor TF1 includes a fifth connecting region A5, a sixth connecting region A6, and a third channel region B3 located between the fifth connecting region A5 and the sixth connecting region A6 in the semiconductor layer P1. The first partition control transistor TF1 further includes a third gate electrode G13 located in the first gate layer G1, and the third gate electrode G13 is disposed opposite to the third channel region B3.

An orthographic projection of the third gate electrode G13 on the base substrate 100 at least partially overlaps with an orthographic projection of the first partition control connecting line GC11 on the base substrate 100, and the orthographic projection of the first partition control connecting line GC11 on the base substrate 100 is located on a side of an orthographic projection of the second gate electrode G12 on the base substrate 100 away from the orthographic projection of the first initialization connecting line VL11 on the base substrate 100.

The first partition control connecting line GC11 is located in the first metal conductive layer SD1, the third gate electrode G13 of the first partition control transistor TF1 is electrically connected to the first partition control connecting line GC11 through a via hole H115 penetrating the interlayer dielectric layer ILD, the fifth connecting region A5 of the first partition control transistor TF1 is electrically connected to the second connecting region A2 of the first initialization transistor TF1, and the sixth connecting region A6 of the first partition control transistor TF1 is electrically connected to the gate electrode of the drive transistor TD.

For example, the sixth connecting region A6 of the first partition control transistor TF1 is electrically connected to the gate electrode of the drive transistor TD through a via hole H116 penetrating the interlayer insulating layer.

The second connecting region A2 of the first initialization transistor TV1, the fourth connecting region A4 of the switch transistor TK and the fifth connecting region A5 of the first partition control transistor TF1 are formed as an integral structure.

The second initialization signal line VL2 extends in the second direction Y. The second initialization signal line VL2 may be electrically connected to the first electrode of the second partition control transistor TF2 through a second initialization connecting line VL21 extending in the first direction X.

The drive transistor TD includes a seventh connecting region A7, an eighth connecting region A8, and a fourth channel region B4 located between the seventh connecting region A7 and the eighth connecting region A8. The drive transistor TD further includes a fourth gate electrode G14 located in the first gate layer G1, and the fourth gate electrode G14 is disposed opposite to the fourth channel region B4.

In the second direction Y, an orthographic projection of the fourth gate electrode G14 on the base substrate 100 is located between an orthographic projection of the second initialization connecting line VL21 on the base substrate 100 and the orthographic projection of the first partition control connecting line GC11 on the base substrate 100.

The seventh connecting region A7 of the drive transistor TD is electrically connected to the second electrode of the light emitting control transistor TEM, and the eighth connecting region A8 of the drive transistor TD is electrically connected to the light emitting device L through a via hole H117 penetrating the interlayer dielectric layer ILD, a via hole H22 penetrating the first insulating layer R1, a via hole H32 penetrating the first passivation layer PVX, a via hole H41 penetrating the second passivation layer and a via hole H51 penetrating the second insulating layer. For example, the eighth connecting region A8 of the drive transistor TD is electrically connected to an anode D11 of the light emitting device L located in the first electrode layer D1.

In some specific embodiments, in one and same pixel circuit, an orthographic projection of the light emitting control transistor TEM on the base substrate 100 is located on a side of the orthographic projection of the drive transistor TD on the base substrate 100 away from the orthographic projection of the first partition control transistor TF1 on the base substrate 100.

For example, in one and same pixel circuit, the light emitting control transistor TEM is located below the drive transistor TD.

The light emitting control transistor TEM includes a ninth connecting region A9, a tenth connecting region A10, and a fifth channel region B5 located between the ninth connecting region A9 and the tenth connecting region A10 in the semiconductor layer P1. The light emitting control transistor TEM further includes a fifth gate electrode G15 located in the first gate layer G1, and the fifth gate electrode G15 is disposed opposite to the fifth channel region B5.

The first power line VDD extends in the second direction Y, and the first power line VDD may be shared by a plurality of pixel circuits arranged in the first direction X. For example, the first power line VDD may be electrically connected to the first electrode of the light emitting control transistor TEM of each of the plurality of pixel circuits through a first power connecting line VDD1 extending in the first direction X.

An orthographic projection of the first power connecting line on the base substrate 100 is located on a side of the orthographic projection of the second initialization connecting line VL21 on the base substrate 100 away from the orthographic projection of the fourth gate electrode G14 on the base substrate 100.

An orthogonal projection of the fifth gate electrode G15 on the base substrate 100 at least partially overlaps with the orthogonal projection of the first power connecting line on the base substrate 100.

The light emitting control signal line EM extends in the first direction X. An orthographic projection of the light emitting control signal line EM on the base substrate 100 is located between the orthographic projection of the second initialization connecting line VL21 on the base substrate 100 and the orthographic projection of the first power connecting line on the base substrate 100.

The first power line VDD is located in the second metal conductive layer SD2, and the first power connecting line VDD1 and the light emitting control signal line EM are both located in the first metal conductive layer SD1. The fifth gate electrode G15 of the light emitting control transistor TEM is electrically connected to the light emitting control signal line EM through a via hole H118 penetrating the interlayer dielectric layer, the ninth connecting region A9 of the light emitting control transistor TEM is electrically connected to the first power connecting line VDD1 through a via hole H119 penetrating the interlayer dielectric layer, and the tenth connecting region A10 of the light emitting control transistor TEM is electrically connected to the seventh connecting region A7 of the driving transistor.

The tenth connecting region A10 of the light emitting control transistor TEM and the seventh connecting region A7 of the drive transistor are formed as an integral structure.

In some specific embodiments, in one and same pixel cell circuit, an orthographic projection of the second initialization transistor TV2 on the base substrate 100 is located on a side of the orthographic projection of the drive transistor TD on the base substrate 100 away from the orthographic projection of the first partition control transistor TF1 on the base substrate 100.

For example, in one and same pixel circuit, the second initialization transistor TV2 is located below the drive transistor TD.

In some specific embodiments, a plurality of pixel circuits arranged in the first direction X may share a second partition control transistor TF2. For example, the second partition control transistor TF2 is electrically connected to the first electrode of the second initialization transistor TV2 of each of the plurality of pixel circuits through a second partition control connecting line VL21 extending in the first direction X.

In the second direction Y, an orthographic projection of a second partition control connecting line GC2 on the base substrate 100 is located between the orthographic projection of the light emitting control signal line EM on the base substrate 100 and an orthographic projection of the second initialization connecting line VL21 on the base substrate 100.

In some specific embodiments, an orthographic projection of at least one second partition control transistor TF2 on the base substrate 100 and an orthographic projection of the second initialization transistor TV2 of the pixel circuit electrically connected to the at least one second partition control transistor TF2 on the base substrate 100 are arranged in the first direction X.

In some specific embodiments, the orthographic projection of the at least one second partition control transistor TF2 on the base substrate 100 at least partially overlaps with an orthographic projection of the partition control signal line GC1 electrically connected to the at least one second partition control transistor TF2 on the base substrate 100.

The second initialization transistor TV2 includes an eleventh connecting region A11. a twelfth connecting region A12, and a sixth channel region B6 located between the eleventh connecting region A11 and the twelfth connecting region A12 in the semiconductor layer P1. The second initialization transistor TV2 further includes a sixth gate electrode G16 located in the first gate layer G1, and the sixth gate electrode G16 is disposed opposite to the sixth channel region B6.

The third scanning line GL3 extends in the first direction X. An orthographic projection of the third scanning line GL3 on the base substrate 100 at least partially overlaps with an orthographic projection of the sixth gate electrode on the base substrate 100.

The third scanning line GL3 and the second partition control connecting line GC2 are both located in the first metal conductive layer SD1, the sixth gate electrode G16 of the second initialization transistor TV2 is electrically connected to the third scanning line GL3 through a via hole H121 penetrating the interlayer dielectric layer ILD, the eleventh connecting region A11 of the second initialization transistor TV2 is electrically connected to the second partition control connecting line GC2 through a via hole H122 penetrating the interlayer dielectric layer ILD, and the twelfth connecting region of the second initialization transistor TV2 is electrically connected to the seventh connecting region A7 of the drive transistor TD.

The twelfth connecting region of the second initialization transistor TV2 and the seventh connecting region A7 of the drive transistor TD are formed as an integral structure.

The second partition control transistor TF2 includes a thirteenth connecting region A13, a fourteenth connecting region A14, and a seventh channel region B7 located between the thirteenth connecting region A13 and the fourteenth connecting region A14 in the semiconductor layer P1. The second partition control transistor TF2 further includes a seventh gate electrode G17 located in the first gate layer G1, and the seventh gate electrode G17 is disposed opposite to the seventh channel region B7.

The second initialization connecting line VL21 is located in the first metal conductive layer SD1, and the seventh gate electrode of the second partition control transistor TF2 and the partition control signal line GC1 are formed as an integral structure. The thirteenth connecting region A13 of the second partition control transistor TF2 is electrically connected to the second initialization connecting line VL21 through a via hole H123 penetrating the interlayer dielectric layer ILD, and the fourteenth connecting region A14 of the second partition control transistor TF2 is electrically connected to the second partition control connecting line GC2 through a via hole H124 penetrating the interlayer dielectric layer ILD.

In the second direction Y, the orthographic projection of the third scanning line on the base substrate 100 is located between the orthographic projection of the second partition control connecting line on the base substrate 100 and the orthographic projection of the second initialization connecting line VL21 on the base substrate 100.

The gate electrode of the drive transistor TD may be electrically connected to a first conductive portion SD11 located in the first metal conductive layer SD1 through the via hole H116 penetrating the interlayer insulating layer, so that the gate electrode of the drive transistor TD and the first conductive portion SD11 in the first metal conductive layer SD1 may jointly form a first electrode plate of a storage capacitor C1.

The eighth connecting region A8 of the drive transistor TD is electrically connected to a second conductive portion G21 located in the second gate layer G2 through the via hole H117 penetrating the interlayer dielectric layer ILD, the via hole H22 penetrating the first insulating layer R1 and the via hole H32 penetrating the first passivation layer PVX, and the second conductive portion G21 may form a second electrode plate of the storage capacitor C1.

A wiring mode of the partition control signal line GC1 in embodiments of the present disclosure will be described below.

In some specific embodiments, for at least one second partition control transistor TF2 and the pixel circuit electrically connected to the at least one second partition control transistor TF2, the second partition control transistor TF2 and the first partition control transistor TF1 in the pixel circuit are electrically connected to one and same partition control signal line GC1.

For example, for a plurality of pixel circuits arranged in the first direction X, the plurality of pixel circuits are all electrically connected to one and same partition control signal line GC1 through the second partition control transistors TF2. Accordingly, the first partition control transistors TF1 in the pixel circuits of six sub-pixels are electrically connected to the partition control signal line GC1.

In this way, a synchronous control of the first partition control transistors TF1 of the plurality of pixel circuits and the second partition control transistors TF2 electrically connected to the plurality of pixel circuits may be realized through a partition control signal line GC1, so that a wiring space may be saved.

In some specific embodiments, the plurality of pixel circuits that are electrically connected by at least one second partition control transistor TF2 are arranged in the first direction X and disposed adjacent to each other.

It should be noted that "adjacent to each other" in the first direction X means that no other pixel circuit is provided between two adjacent pixel circuits in the first direction X. The second electrode of the second partition control transistor TF2 may be electrically connected to the above-mentioned second partition control connecting line extending in the first direction X, so as to be electrically connected to the plurality of pixel circuits arranged in the first direction X and disposed adjacent to each other through the second partition control connecting line.

In some specific embodiments, the display substrate includes a plurality of pixel cells, and at least one of the pixel cells includes a plurality of sub-pixels with different colors. For example, the at least one pixel cell includes the above-mentioned first sub-pixel, the above-mentioned second sub-pixel and the above-mentioned third sub-pixel, the first sub-pixel is a red sub-pixel, the second sub-pixel is a green sub-pixel, and the third sub-pixel is a blue sub-pixel. In the first direction X, the plurality of pixel cells include first pixel cells and second pixel cells that are alternately arranged. Among the plurality of pixel circuits electrically connected to at least one of the second partition control transistors TF2, a part of the pixel circuits belong to sub-pixels in the first pixel cells, and the other part of the pixel circuits belong to sub-pixels in the second pixel cells.

Among six pixel circuits electrically connected to the second partition control transistor TF2, the three pixel circuits on the left side belong to the sub-pixels in the first pixel cell, and the three pixel circuits on the right side belong to the sub-pixels in the second pixel cell. In this way, the second partition control transistor TF2 is shared by two pixel cells arranged in the first direction X and disposed adjacent to each other, so that the number of the second partition control transistors TF2 may be greatly saved on the basis of realizing a control effect of the second partition control transistor TF2.

In some specific embodiments, the pixel circuits in the plurality of sub-pixels are arranged in an array in the first direction X and the second direction Y. At least one partition control signal line GC1 is electrically connected to the first partition control transistors TF1 in a plurality of columns of pixel circuits, and different partition control signal lines GC1 are electrically connected to the first partition control transistors TF1 in different columns of pixel circuits.

For example, the partition control signal lines GC1 are electrically connected to the first partition control transistors TF1 in six columns of pixel circuits, so that the number of the partition control signal lines GC1 may be greatly reduced on the basis of ensuring that each partition control signal line GC1 has a good electrical performance.

In some specific embodiments, at least one partition control signal line GC1 extends in the second direction Y, and an orthographic projection of the at least one partition control signal line GC1 on the base substrate 100 is located between orthographic projections of two adjacent sub-pixels in the first pixel cell on the base substrate 100.

In embodiments of the present disclosure, in the first pixel cell, a gap between two of three sub-pixels is greater than the other two gaps. For example, a gap between the second sub-pixel and the third sub-pixel is greater than a gap between the first sub-pixel and the second sub-pixel. Therefore, the partition control signal line GC1 may be provided in the gap between the second sub-pixel and the third sub-pixel.

In some specific embodiments, orthographic projections of the plurality of partition control signal lines GC1 on the base substrate 100 are spaced apart by orthographic projections of the second pixel cells on the base substrate 100. In other words, two adjacent partition control signal lines GC1 are spaced apart from each other by the second pixel cell. The two adjacent partition control signal lines GC1 mean that no other partition control signal line GC1 is provided between the two partition control signal lines GC1.

As shown in FIG. 2, in some specific embodiments, the display substrate further includes a plurality of flip-chip thin films disposed on the base substrate 100 and located in the non-display region, at least one of the flip-chip thin films is electrically connected to the plurality of partition control signal lines GC1, and different flip-chip thin films are electrically connected to different partition control signal lines GC1. At least one of the flip-chip thin films is capable of providing different partition control signals for at least two of the plurality of partition control signal lines GC1 electrically connected to at least one of the flip-chip thin films.

The flip-chip thin film is disposed at an edge of the display substrate. For example, the flip-chip thin film is disposed on a lower side of the display substrate. The flip-chip thin film is flexible, and may be bent from a front side (i.e., a side provided with the pixel cell) of the display substrate to a back side of the display substrate, so that a signal line disposed on the front side of the display substrate may be electrically connected to a drive chip disposed on the back side of the display substrate through the flip-chip thin film. Therefore, the drive chip may provide an electrical signal to a corresponding signal line through the flip-chip thin film.

The partition control signal lines GC1 in the display region may be divided according to the number of flip-chip thin films COF. For example, the partition control signal lines GC1 may be divided into a plurality of groups, each group includes a plurality of partition control signal lines GC1, and the partition control signal lines GC1 of different groups are different. Each flip-chip thin film COF is electrically connected to a plurality of groups of partition control signal lines GC1, and the flip-chip thin film may provide different partition control signals for the plurality of groups of partition control signal lines GC1 electrically connected to the flip-chip thin film. For example, the flip-chip thin film is electrically connected to two groups of partition control signal lines GC1, and the flip-chip thin film may provide an effective level signal for a group of partition control signal lines GC1 and provide a non-effective level signal for the other group of partition control signal lines GC1.

In some specific embodiments, the non-display region includes a first sub-region located on a first side of the display region, and the plurality of flip-chip thin films are disposed in the first sub-region. For example, as shown in FIG. 2, the first side is a lower side of the display region. In addition, the non-display region further includes a second sub-region disposed opposite to the first sub-region, and a third sub-region and a fourth sub-region that are located on left and right sides of the display region. Corresponding leads may also be provided in the second sub-region, the third sub-region and the fourth sub-region. For example, a lead of a second power line is also provided in the second sub-region, the third sub-region and the fourth sub-region, and the lead may provide a second power line signal for the second power line in the display region. The second power line may be electrically connected to a second electrode of the light emitting device L, so that the light emitting device L may emit light in response to a drive current provided by the drive transistor TD to a first electrode of the light emitting device L and the second power line provided by the second power line to the second electrode of the light emitting device L.

For example, the first electrode of the light emitting device L may refer to an anode of the light emitting device L, and the second electrode of the light emitting device L may refer to a cathode of the light emitting device L.

Figure 19:
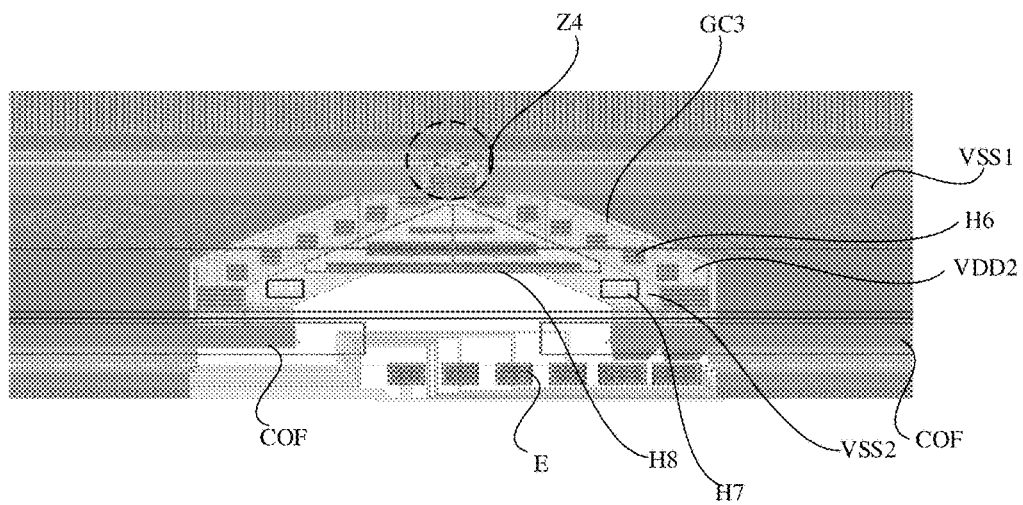
FIG. 19 schematically shows a schematic plan view at a position Z3 in FIG. 2 according to embodiments of the present disclosure.

FIG. 19 schematically shows a schematic plan view at a position Z3 in FIG. 2 according to embodiments of the present disclosure. As shown in FIG. 2 and FIG. 19, signal lines such as the data signal line DL, the partition control signal line GC, the first power line VDD, etc. on the display substrate are first electrically connected to leads of various signal lines extending in the first direction in the first sub-region, and then each lead is electrically connected to the flip-chip thin film COF through a corresponding connecting line.

The leads of the various signal lines may extend in the first direction X, and connecting lines for electrically connecting each lead line with the flip-chip thin film COF may be obliquely disposed.

As shown in FIG. 19, the embodiment schematically shows arrangements of a connecting line VDD2 of a first power line lead, a connecting line VSS2 of a second power line lead, and a connecting line (that is, a second connecting line GC4 that will be described below) of the partition control signal lead, all of which are obliquely disposed so as to be electrically connected to the flip-chip thin film COF located below. Since a plurality of film layers are provided in FIG. 19, only the second power lead VSS1 in the plurality of leads is identified for clarity. The first power line lead, the second power line lead, the partition control signal lead, and the first initialization signal lead will be described in detail below, and will not be repeated here.

The connecting line VDD2 of the first power line lead includes a part located in the first metal conductive layer SD1 and a part located in the first gate layer G1. The first power line lead is located in the first gate layer G1, and the first power line lead is in contact with a part of the connecting line of the first power line located in the first gate layer G1. Said part is connected to the part of the connecting line located in the first metal conductive layer SD1 through a via hole H6 penetrating the interlayer insulating layer ILD. The part of the connecting line located in the first metal conductive layer SD1 is electrically connected to the flip-chip thin film COF.

The connecting line VSS2 of the second power line lead includes a part located in the first metal conductive layer SD1, a part located in the second metal conductive layer SD2 and a part located in the first electrode layer D1. The second power line lead is located in the first electrode layer D1, and the second power line lead is in contact with a part of the connecting line of the second power line located in the first electrode layer D1, said part is connected to the part of the connecting line located in the second metal conductive layer SD2 through a via hole penetrating the second insulating layer R2 and the second passivation layer PVX, and then in contact with a part of the connecting line located in the first metal conductive layer SD1 through structures such as a via hole H7 and a slit H8 penetrating the first insulating layer R1 and the first passivation layer PVX1. Finally, the part of the connecting line located in the first metal conductive layer SD1 is electrically connected to the flip-chip thin film COF.

A test signal terminal E may also be provided between two adjacent flip-chip thin films COF. The flip-chip thin films COF are electrically connected to the test signal terminals E through the connecting lines. The test signal terminal E is used to be electrically connected to a test device when testing the display substrate, so that the test device may provide a test signal to the flip-chip thin film COF through the test signal terminal E, so as to test the display substrate.

Figure 20:
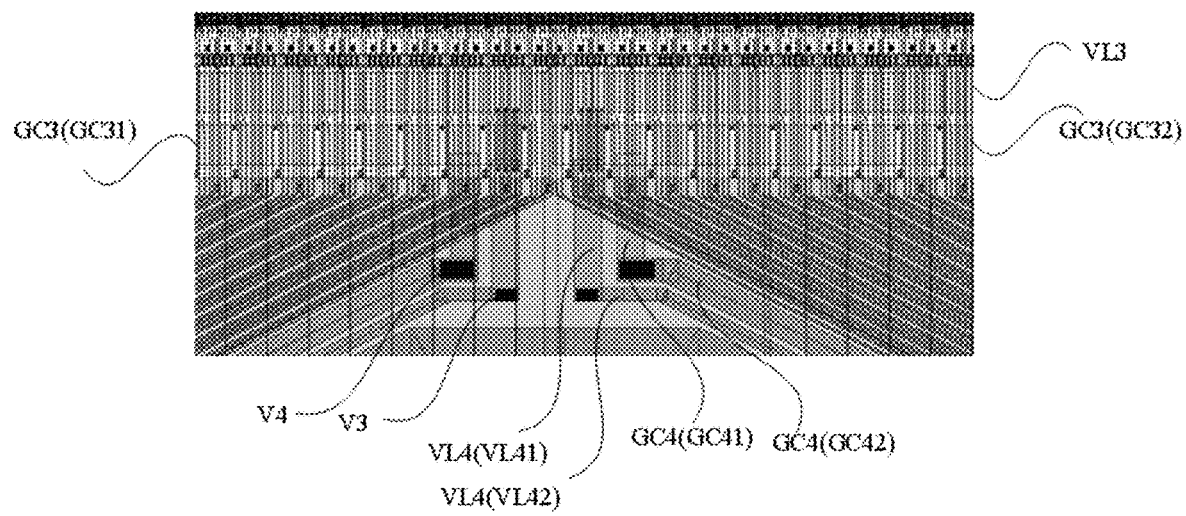
FIG. 20 is a schematic plan view at a position Z4 in FIG. 19 according to embodiments of the present disclosure.
Figure 21:
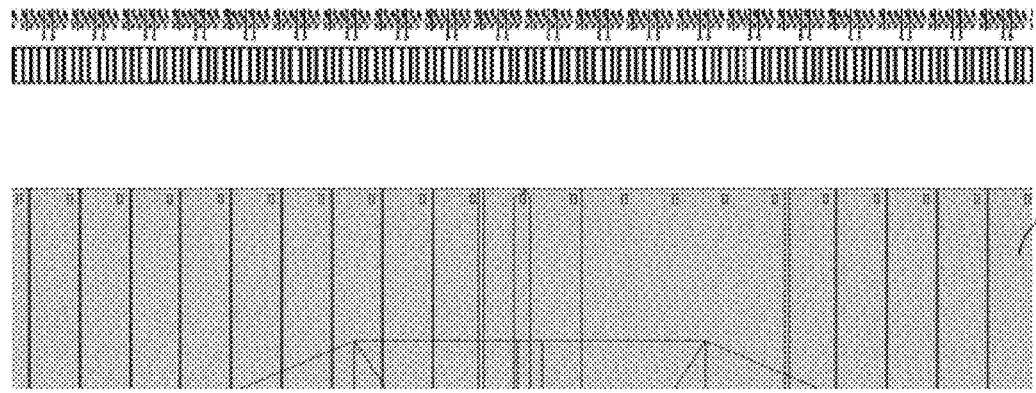
Figure 22:
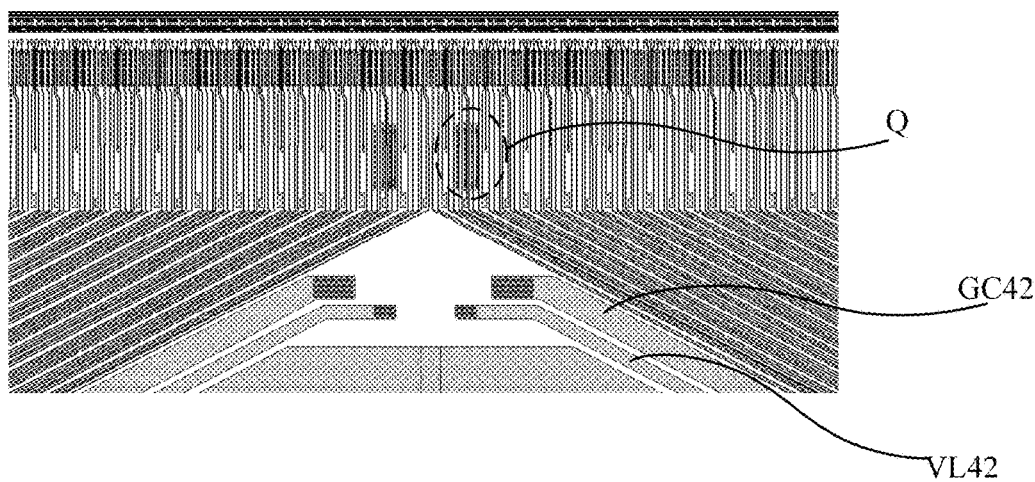
Figure 23:
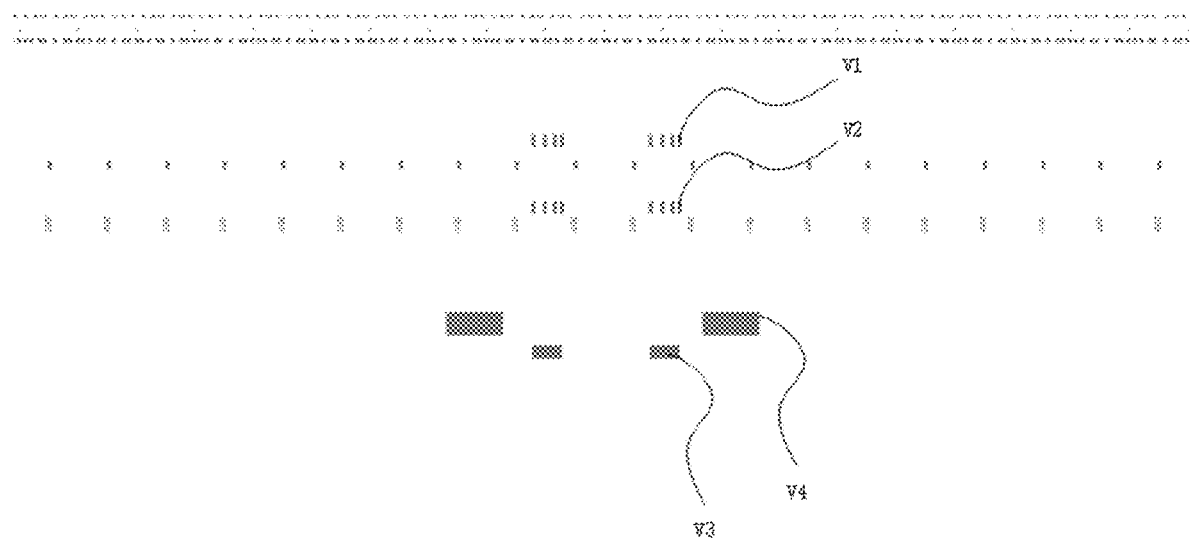
Figure 24:
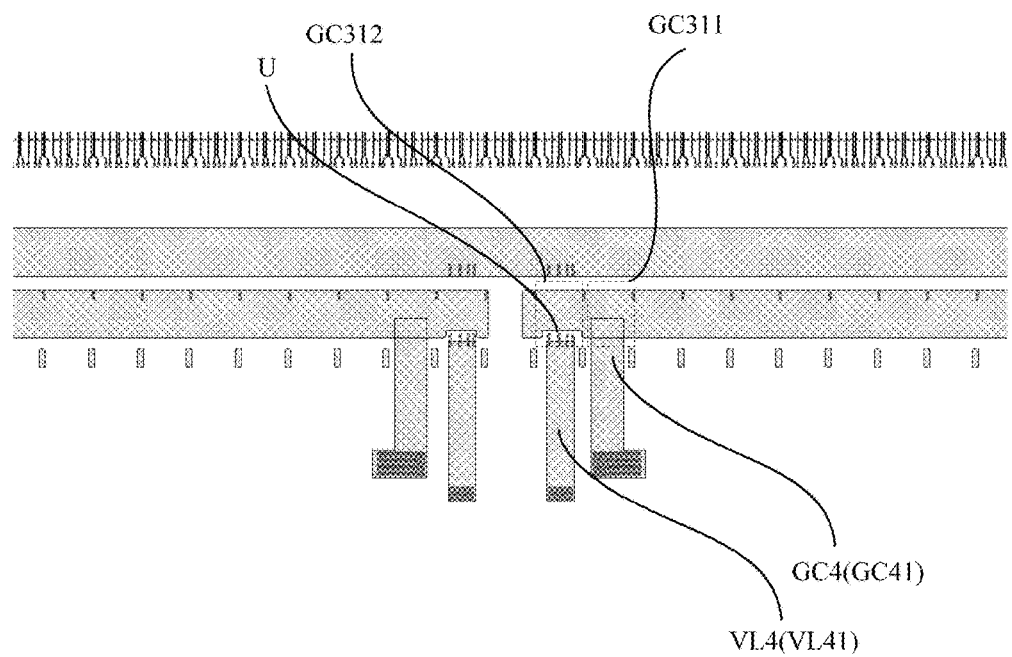
Figure 25:
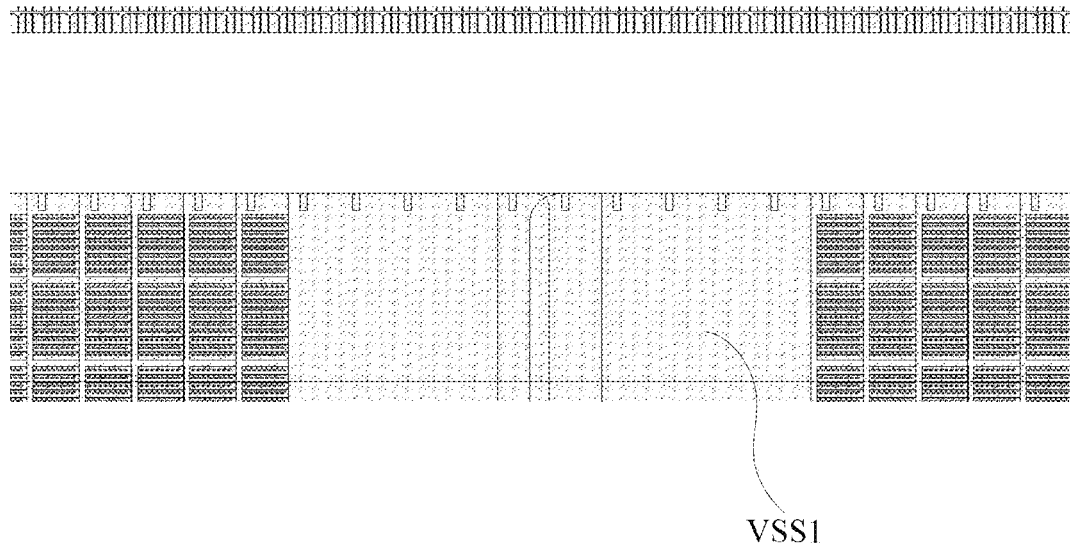

FIG. 20 is a schematic plan view at a position Z4 in FIG. 19 according to embodiments of the present disclosure, and FIG. 21 to FIG. 25 are schematic plan views of main film layers in FIG. 20. Among them, FIG. 21 is a schematic plan view of the first gate layer, FIG. 22 is a schematic plan view of the first metal conductive layer, FIG. 23 is a schematic plan view of a spacer layer (such as the first insulating layer R1 and the first passivation layer PVX1 described above), FIG. 24 is a schematic plan view of a second metal conductive layer, and FIG. 25 is a schematic plan view of the first electrode layer.

As shown in FIG. 2, FIG. 20 to FIG. 25, the display substrate further includes a plurality of partition control signal leads GC3 and a first initialization signal lead VL3 disposed on the base substrate 100 and located in the first sub-region, and the first initialization signal lead VL3 and the plurality of partition control signal leads GC3 all extend in the first direction X. The plurality of first initialization signal lines VL1 are electrically connected to the first initialization signal lead VL3. At least one flip-chip thin film COF is electrically connected to corresponding partition control signal lines GC1 through the plurality of partition control signal leads GC3. An orthographic projection of the partition control signal lead GC3 on the base substrate 100 is located on a side of an orthographic projection of the first initialization signal lead VL3 on the base substrate 100 away from an orthographic projection of the display region on the base substrate 100.

For example, the partition control signal lead GC3 is located on a lower side of the first initialization signal lead VL3. The plurality of first initialization signal lines VL1 may be electrically connected to one and same first initialization signal lead VL3, and the plurality of first initialization signal lines VL1 may be electrically connected to at least one flip-chip thin film COF through the first initialization signal lead VL3, and then electrically connected to the drive chip through the flip-chip thin film COF.

In some specific embodiments, the at least one flip-chip thin film COF includes a first partition control terminal C1 and a second partition control terminal C2. The first partition control terminal C1 and the second partition control terminal C2 may provide different partition control signals, and the plurality of partition control signal leads GC3 include first partition control signal leads GC31 and second partition control signal leads GC32 alternately arranged in the first direction X. For the plurality of partition control signal lines GC1 electrically connected to the at least one flip-chip thin film COF, a part of the partition control signal lines GC1 are electrically connected to the first partition control terminal C1 through the first partition control signal leads GC31, and the other part of the partition control signal lines GC1 are electrically connected to the second partition control terminal C2 through the second partition control signal leads GC32.

For the first partition control signal lead GC31 and the second partition control signal lead GC32 that are electrically connected to at least one flip-chip thin film COF, in the second direction Y, an orthographic projection of the flip-chip thin film COF on the base substrate 100 at least partially overlaps with an orthographic projection of the first partition control signal lead GC31 on the base substrate 100 and an orthographic projection of the second partition control signal lead GC32 on the base substrate 100.

The first partition control terminal C1 and the second partition control terminal C2 may be located on two opposite sides of the flip-chip thin film COF. For example, the first partition control terminal C1 may be disposed on a left side of the flip-chip thin film COF and the second partition control terminal C2 may be disposed on a right side of the flip-chip thin film COF. For the plurality of partition control signal lines GC1 electrically connected to the at least one flip-chip thin film COF, a part of the partition control signal lines GC1 on the left side are electrically connected to the first partition control terminal C1 through the first partition control signal leads GC31, and a part of the partition control signal lines GC1 on the right side are electrically connected to the second partition control terminal C2 through the second partition control signal leads GC32.

In some specific embodiments, the plurality of partition control signal lines GC1 electrically connected to the first partition control terminal C1 are arranged in the first direction X and disposed adjacent to each other, and the plurality of partition control signal lines GC1 electrically connected to the second partition control terminal C2 are arranged in the first direction X and disposed adjacent to each other.

The numbers of partition control signal lines GC1 electrically connected to the plurality of flip-chip thin films COF are the same. Further, for at least one flip-chip thin film COF, the number of partition control signal lines GC1 electrically connected to the first partition control terminal C1 is the same as the number of partition control signal lines GC1 electrically connected to the second partition control signal terminal. For example, for a display substrate with a resolution of 8K, 16 flip-chip thin films COF may be provided thereon, and the display substrate with the resolution of 8K includes 2160 rows×7680 columns of pixel cells. As mentioned above, every two columns of pixel cells may share a partition control signal line GC1. Therefore, 3840 partition control signal lines GC1 may be provided on the display substrate. The 3840 partition control signal lines GC1 may be evenly distributed to the first partition control terminal C1 and the second partition control terminal C2 of the plurality of flip-chip thin films COF. For example, for each flip-chip thin film COF, the first partition control terminal C1 is electrically connected to 120 partition control signal lines GC1, and the second partition control terminal C2 is also electrically connected to 120 partition control signal lines GC1. In this way, a flip-chip thin film COF may provide partition control signals to 480 columns of pixel cells, and the flip-chip thin film COF may provide different partition control signals (effective or non-effective level signals) to 240 columns of pixel cells located on the left side and 240 columns of pixel cells located on the right side. In other words, for the display substrate with the resolution of 8K, the 7680 rows of pixel cells thereon may be divided into 32 groups (each group includes 240 rows of pixel cells), and the partition control signals may be independently provided for the 32 groups of pixel cells.

In some specific embodiments, the display substrate further includes a first power lead VDD1 disposed on the base substrate 100 and located in the first sub-region, and the first power lead VDD1 extends in the first direction X. The first power lead VDD1 is electrically connected to the plurality of first power lines VDD. The orthographic projection of the partition control signal lead GC3 on the base substrate 100 is located between the orthographic projection of the first initialization signal lead VL3 on the base substrate 100 and an orthographic projection of the first power lead VDD1 on the base substrate 100.

The plurality of first power lines VDD1 may be electrically connected to one and same first power lead VDD1, and the plurality of first power lines VDD may be electrically connected to at least one flip-chip thin film COF through the first power lead VDD1, and then electrically connected to the drive chip through the flip-chip thin film COF.

In the first sub-region, a third power lead extending in the first direction X may be further provided. A plurality of second power lines in the display region may also be electrically connected to corresponding signal terminals through the third power lead VSS1. An orthographic projection of the third power lead VSS1 on the base substrate 100 may be located on a side of the orthographic projection of the partition control signal lead GC3 on the base substrate 100 away from the orthographic projection of the first initialization signal lead VL3 on the base substrate 100.

In the first sub-region, an anti-static lead extending in the first direction X may be further provided. A plurality of anti-static structures are electrically connected to the anti-static lead to lead out a static electricity on the display substrate, which may prevent the static electricity from burning an electrical device on the display substrate.

An orthogonal projection of the anti-static lead on the base substrate 100 may be located on a side of the orthographic projection of the first initialization signal lead VL3 on the base substrate 100 away from the orthographic projection of the partition control signal lead GC3 on the base substrate 100.

In some specific embodiments, the display substrate includes: the semiconductor layer P1 disposed on the base substrate 100; the first gate layer G1 disposed on a side of the semiconductor layer P1 away from the base substrate 100; the second gate layer G2 disposed on a side of the first gate electrode G1 away from the base substrate 100; the first metal conductive layer SD1 disposed on a side of the second gate layer G2 away from the base substrate 100; the second metal conductive layer SD2 disposed on a side of the first metal conductive layer SD1 away from the base substrate 100; and the first electrode layer DI disposed on a side of the second metal conductive layer SD2 away from the base substrate 100. The plurality of partition control signal leads GC3 and the plurality of first initialization signal leads VL3 are all located in the second metal conductive layer SD2. That is, the plurality of partition control signal leads GC3 and the plurality of first initialization signal leads VL3 are disposed in the same layer and are made of the same material.

In some specific embodiments, the partition control signal line GC1 and the first initialization signal line VL1 are both located in the second metal conductive layer SD2. That is, the plurality of partition control signal lines GC1 and the plurality of first initialization signal lines VL1 are disposed in the same layer and are made of the same material.

In some specific embodiments, the display substrate further includes: a plurality of bridging lines Q disposed on the base substrate 100 and located in the first sub-region, a plurality of first connecting lines VL4 disposed on the base substrate 100 and located in the first sub-region, and a plurality of second connecting lines GC4 disposed on the base substrate 100 and located in the first sub-region. The plurality of bridging lines Q are located in the first metal conductive layer SD1. The first initialization signal lead VL3 is electrically connected to a first end of at least one first connecting line VL4 by crossing at least one partition control signal lead GC3 through at least one of the bridging lines Q, and a second end of the first connecting line VL4 is electrically connected to at least one flip-chip thin film COF. At least one partition control signal lead GC3 is electrically connected to at least one flip-chip thin film COF through at least one of the second connecting lines GC4. For at least one partition control signal lead GC3, the partition control signal lead GC3 includes a first part GC311 electrically connected to the second connecting line GC4 and a second part GC312 crossed by the bridging line Q. An orthographic projection of the first part GC311 on the base substrate 100 is spaced apart from an orthographic projection of the second part GC312 on the base substrate 100.

The bridging line Q may be provided corresponding to the partition control signal lead GC3. For example, a bridging line Q is provided corresponding to each partition control signal lead GC3.

For at least one bridging line Q, the bridging line Q may include a plurality of sub-lines arranged in the first direction X. A short circuit between the bridging line Q and a lead originally located at the position and deployed in the first metal conductive layer SD1 may be prevented through an arrangement of the plurality of sub-lines.

In some specific embodiments, for at least one partition control signal lead GC3, the orthographic projection of the first part GC311 on the base substrate 100 is located between the orthographic projection of the second part GC312 on the base substrate 100 and an orthographic projection of a center of the partition control signal lead GC3 on the base substrate 100.

For example, as shown in the drawings, for two partition control signal leads GC3 adjacent in the first direction X, the first part GC311 is located on a left side of the second part GC312 in the left partition control signal lead GC3, and the first part GC311 is located on a right side of the second part GC312 in the right partition control signal lead GC3.

In some specific embodiments, the display substrate further includes a spacer layer disposed between the first metal conductive layer SD1 and the second metal conductive layer SD2, and the spacer layer may include the above-mentioned first insulating layer R1 and the above-mentioned first passivation layer PVX1. A plurality of first via holes V1 and a plurality of second via holes V2 are provided on the spacer layer. At least one bridging line Q is electrically connected to the first initialization lead VL3 through at least one first via hole V1. and at least one bridging line Q is electrically connected to at least one first connecting line VL4 through at least one second via hole V2. An orthographic projection of at least one first via hole V1 on the base substrate 100 at least partially overlaps with the orthographic projection of the first initialization lead VL3 on the base substrate 100, a recess U is provided on at least one partition control signal lead GC3, and an orthographic projection of the recess U on the base substrate 100 at least partially overlaps with an orthographic projection of at least one second via hole V2 on the base substrate 100. A connection position of the bridging line Q and the first connecting line VL4 may be provided in a relatively empty region through the recess U on the partition control signal lead GC3, so as to prevent a short circuit between the bridging line Q along with the first connecting line VL4 and other signal lines.

In some specific embodiments, at least one first via hole V1 and at least one second via hole V2 are arranged in the second direction Y. For example, the first via hole V1 and the second via hole V2 that correspond to the same bridging line Q are arranged in the second direction Y, so that the bridging line Q extends in the second direction Y, and thus a length of the bridging line Q may be shortened as much as possible.

In some specific embodiments, at least one first connecting line VL4 includes a first connecting part VL41 and a second connecting part VL42, and at least one second connecting line GC4 includes a third connecting part GC41 and a fourth connecting part GC42. For one and same first connecting line VL4, a first end of the first connecting part VL41 is electrically connected to at least one bridging line Q, and a second end of the first connecting part VL41 is electrically connected to at least one flip-chip thin film COF through the second connecting part VL42. For one and same second connecting line GC4, a first end of the third connecting part GC41 is electrically connected to at least one partition control signal lead GC3. and a second end of the third connecting part GC41 is electrically connected to at least one flip-chip thin film COF through the fourth connecting portion GC42. The first connecting part VL41 and the third connecting part GC41 are both located in the second metal conductive layer SD2, and the second connecting part VL42 and the fourth connecting part GC42 are both located in the first metal conductive layer SD1.

The first connecting part VL41 and the third connecting part GC41 both extend in the second direction Y, and an orthographic projection of the first connecting portion VL41 and an orthographic projection of the third connecting portion GC41 on the base substrate 100 at least partially overlap with the orthographic projection of the first power lead VDD1 on the base substrate 100.

In some specific embodiments, the display substrate further includes a spacer layer disposed between the first metal conductive layer SD1 and the second metal conductive layer SD2, and a plurality of third via holes V3 and a plurality of fourth via holes V4 are provided on the spacer layer. For one and same first connecting line VL4, the first connecting part VL41 is electrically connected to the second connecting part VL42 through at least one third via hole V3. For one and same second connecting line GC4, the third connecting part GC41 is electrically connected to the fourth connecting part GC42 through at least one fourth via hole V4. An orthographic projection of a connecting line between two adjacent third via holes V3 on the base substrate 100 is located on a side of an orthographic projection of a connecting line between two adjacent fourth via holes V4 on the base substrate 100 away from the orthographic projection of the display region on the base substrate 100.

For example, for the third via hole V3 and the fourth via hole V4 on the left side, the third via hole V3 is located at the lower right of the fourth via hole V4, and for the third via hole V3 and the fourth via hole V4 on the right side, the third via hole V3 is located at the lower left of the fourth via hole V4.

An orthographic projection of the third via hole V3 and an orthographic projection of the fourth via hole V4 on the base substrate 100 are located within a range of the orthographic projection of the first power lead VDD1 on the base substrate 100.

At least some embodiments of the present disclosure further provide a method of driving a display substrate. The method is used to drive the above-mentioned display substrate, and the method includes:
  controlling a plurality of sub-pixels in a first display region to refresh at a first refresh rate in response to a first partition control signal on at least one of a plurality of partition control signal lines; and
  controlling a plurality of sub-pixels in a second display region to refresh at a second refresh rate in response to a second partition control signal on at least another of the plurality of partition control signal lines,
  the first display region and the second display region are different sub-regions of the display region, respectively, and the first refresh rate is higher than the second refresh rate.

Figure 26:
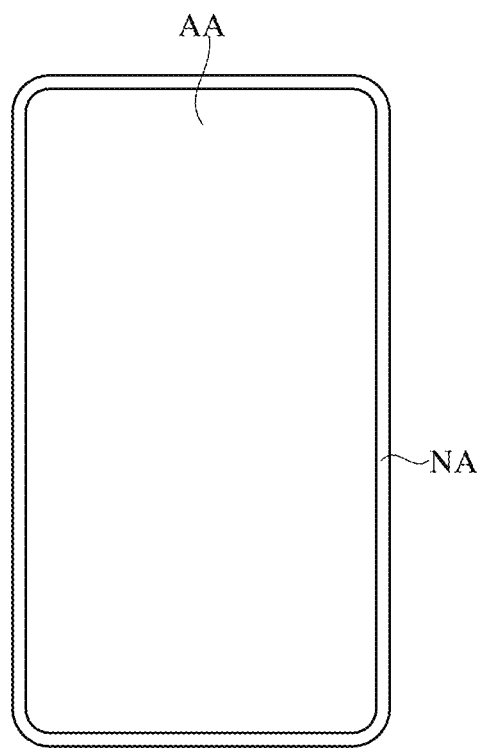
FIG. 26 is a schematic diagram of a display panel according to embodiments of the present disclosure.

At least some embodiments of the present disclosure further provide a display panel. FIG. 26 is a schematic diagram of a display panel according to embodiments of the present disclosure. As shown in FIG. 26, the display panel includes the above-mentioned display substrate, which has the display region, the non-display region and related structures therein. For example, the display panel may be an OLED display panel.

At least some embodiments of the present disclosure further provide a display device. The display device may include any apparatus or product with a display function. For example, the display device may be a smart phone, a mobile phone, an e-book reader, a desktop computer (PC), a laptop computer PC, a netbook PC, a personal digital assistant (PDA), a portable multimedia player (PMP), a digital audio player, a mobile medical apparatus, a camera, a wearable apparatus (such as a head-mounted apparatus, an electronic clothing, an electronic bracelet, an electronic necklace, an electronic accessory, an electronic tattoo or a smart watch), a television, etc.

It should be understood that a display device according to embodiments of the present disclosure has all features and advantages of the above-mentioned display substrate, reference thereof may be made to the above-mentioned descriptions for details, which will not be repeated here.

Although some embodiments of the general technical concept of the present disclosure have been illustrated and described, those skilled in the art may understand that various changes may be made to these embodiments without departing from the principle and spirit of the general technical concept, and the scope of the present disclosure is defined by the claims and their equivalents.

What is claimed is:

1. A display substrate, the display substrate comprising a display region and a non-display region, wherein the display substrate comprises:
  a base substrate;

a plurality of data signal lines, a plurality of first scanning signal lines, a plurality of partition control signal lines, a plurality of first initialization signal lines and a plurality of second scanning signal lines disposed on the base substrate; and a plurality of sub-pixels disposed on the base substrate and located in the display region, wherein the plurality of sub-pixels are arranged in an array in a first direction and a second direction in the display region, the first direction intersects the second direction, and at least one of the plurality of sub-pixels comprises a pixel circuit and a light emitting device, wherein the pixel circuit comprises a switch transistor, a first partition control transistor, a drive transistor and a first initialization transistor;

wherein the switch transistor is electrically connected to at least one of the plurality of first scanning signal lines and at least one of the plurality of data signal lines, the first initialization transistor is electrically connected to at least one of the plurality of first initialization signal lines and at least one of the plurality of second scanning signal lines, the drive transistor is electrically connected to the light emitting device, and the first partition control transistor is electrically connected to the switch transistor, the first initialization transistor, the drive transistor and at least one of the plurality of partition control signal lines;

wherein the switch transistor is configured to: transmit a data signal on the data signal line to the first partition control transistor in response to a first scanning signal on the first scanning signal line; the first initialization transistor is configured to: transmit a first initialization signal on the first initialization signal line to the first partition control transistor in response to a second scanning signal on the second scanning signal line; the first partition control transistor is configured to: in response to a partition control signal on the partition control signal line, selectively transmit a received first initialization signal to a gate electrode of the drive transistor in an initialization phase and selectively transmit a received data signal to the gate electrode of the drive transistor in a data writing phase; and the drive transistor is configured to: provide a drive signal to the light emitting device in response to a voltage difference between the gate electrode of the drive transistor and a first electrode of the drive transistor; and wherein in one and same pixel circuit, in the second direction, an orthographic projection of the first partition control transistor on the base substrate is located between an orthographic projection of the first initialization transistor on the base substrate and an orthographic projection of the drive transistor on the base substrate.

2. The display substrate according to claim 1, wherein in one and same pixel circuit, an orthographic projection of the first partition control transistor on the base substrate and an orthographic projection of the switch transistor on the base substrate are arranged in the first direction.

3. The display substrate according to claim 1, wherein the display substrate further comprises a plurality of light emitting control signal lines and a plurality of first power lines disposed on the base substrate;

wherein the pixel circuit further comprises a light emitting control transistor electrically connected to the drive transistor, at least one of the plurality of light emitting control signal lines and at least one of the plurality of first power lines;

wherein the light emitting control transistor is configured to: transmit a first voltage signal on the first power line to the first electrode of the drive transistor in response to a light emitting control signal on the light emitting control signal line; and wherein in one and same pixel circuit, an orthographic projection of the light emitting control transistor on the base substrate is located on a side of an orthographic projection of the drive transistor on the base substrate away from an orthographic projection of the first partition control transistor on the base substrate.

4. The display substrate according to claim 1, wherein the display substrate further comprises a plurality of second partition control transistors, a plurality of third scanning signal lines and a plurality of second initialization signal lines disposed on the base substrate, and at least one of the plurality of second partition control transistors is electrically connected to at least one of the plurality of partition control signal lines, at least one of the plurality of second initialization signal lines and pixel circuits in the plurality of sub-pixels; and wherein the at least one of the second partition control transistors is configured to: selectively transmit a second initialization signal on the second initialization signal line to the pixel circuit electrically connected to the second partition control transistor, in response to a partition control signal on the partition control signal line.

5. The display substrate according to claim 4, wherein the pixel circuit further comprises a second initialization transistor, the pixel circuit is electrically connected to the second partition control transistor through the second initialization transistor, and the second initialization transistor is further electrically connected to the drive transistor and at least one of the plurality of third scanning signal lines; and wherein the second initialization transistor is configured to: transmit a received second initialization signal to the first electrode of the drive transistor in response to a third scanning signal on the third scanning signal line.

6. The display substrate according to claim 5, wherein in one and same pixel circuit, an orthographic projection of the second initialization transistor on the base substrate is located on a side of an orthographic projection of the drive transistor on the base substrate away from an orthographic projection of the first partition control transistor on the base substrate.

7. The display substrate according to claim 5, wherein an orthographic projection of the at least one of the second partition control transistors on the base substrate and an orthographic projection of the second initialization transistor of the pixel circuit electrically connected to the at least one of the second partition control transistors are arranged in the first direction.

8. The display substrate according to claim 4, wherein an orthographic projection of the at least one of the second partition control transistors on the base substrate at least partially overlaps with an orthographic projection of the partition control signal line electrically connected to the at least one of the second partition control transistors on the base substrate.

9. The display substrate according to claim 4, wherein for the at least one of the second partition control transistors and the pixel circuit electrically connected to the at least one of the second partition control transistors, the second partition control transistor and the first partition control transistor in the pixel circuit are electrically connected to one and same partition control signal line.

10. The display substrate according to claim 4, wherein a plurality of pixel circuits electrically connected to the at least one of the second partition control transistors are arranged in the first direction and disposed adjacent to each other.

11. The display substrate according to claim 10, wherein the display substrate comprises a plurality of pixel cells, at least one of the plurality of pixel cells comprises a plurality of sub-pixels with different colors, and in the first direction, the plurality of pixel cells comprise a first pixel cell and a second pixel cell arranged alternately; and
   wherein in the plurality of pixel circuits electrically connected to the at least one second partition control transistor, a part of the plurality of pixel circuits belong to the sub-pixels in the first pixel cell, and the other part of the pixel circuits belong to the sub-pixels in the second pixel cell.

12. The display substrate according to claim 1, wherein pixel circuits in the plurality of sub-pixels are arranged in an array in the first direction and the second direction; and
   wherein the at least one of the partition control signal lines is electrically connected to the first partition control transistor in a plurality of columns of pixel circuits, and different partition control signal lines are electrically connected to the first partition control transistors in different columns of pixel circuits.

13. The display substrate according to claim 11, wherein pixel circuits in the plurality of sub-pixels are arranged in an array in the first direction and the second direction;
   wherein the at least one of the partition control signal lines is electrically connected to the first partition control transistor in a plurality of columns of pixel circuits, and different partition control signal lines are electrically connected to the first partition control transistors in different columns of pixel circuits;
   wherein the at least one of the partition control signal lines extends in the second direction, and an orthographic projection of at least one of the partition control signal lines on the base substrate is located between orthographic projections of two adjacent sub-pixels in the first pixel cell on the base substrate;
   wherein orthographic projections of the plurality of partition control signal lines on the base substrate are spaced apart from an orthographic projection of the second pixel cell on the base substrate; and
   wherein the plurality of the partition control signal lines electrically connected to the first partition control terminal are arranged in the first direction and disposed adjacent to each other, and the plurality of the partition control signal lines electrically connected to the second partition control terminal are arranged in the first direction and disposed adjacent to each other.

14. The display substrate according to claim 1, wherein the display substrate further comprises a plurality of flip-chip thin films disposed on the base substrate and located in the non-display region, at least one of the plurality of flip-chip thin films is electrically connected to the plurality of partition control signal lines, and different flip-chip thin films are electrically connected to different partition control signal lines;
   wherein the at least one of the plurality of flip-chip thin films is capable of providing different partition control signals for at least two of the plurality of partition control signal lines electrically connected to the at least one of the plurality of flip-chip thin films;
   wherein the non-display region comprises a first sub-region located on a first side of the display region, the plurality of flip-chip thin films are disposed in the first sub-region, the display substrate further comprises a plurality of partition control signal leads and a first initialization signal lead disposed on the base substrate and located in the first sub-region, and the first initialization signal lead and the plurality of partition control signal leads all extend in the first direction;
   wherein the plurality of first initialization signal lines are electrically connected to the first initialization signal lead;
   wherein at least one of the plurality of flip-chip thin films is electrically connected to a corresponding partition control signal line through the plurality of partition control signal leads;
   wherein an orthographic projection of the partition control signal lead on the base substrate is located on a side of an orthographic projection of the first initialization signal lead on the base substrate away from an orthographic projection of the display region on the base substrate;
   wherein the at least one of the flip-chip thin films comprises a first partition control terminal and a second partition control terminal, the first partition control terminal and the second partition control terminal are capable of providing different partition control signals, and the plurality of the partition control signal leads comprise a first partition control signal lead and a second partition control signal lead arranged alternately in the first direction;
   wherein for the plurality of partition control signal lines electrically connected to at least one of the flip-chip thin films, a part of the plurality of partition control signal lines are electrically connected to the first partition control terminal through the first partition control signal lead, and the other part of the plurality of partition control signal lines are electrically connected to the second partition control terminal through the second partition control signal lead;
   wherein the display substrate further comprises a first power lead disposed on the base substrate and located in the first sub-region, and the first power lead extends in the first direction;
   wherein the first power lead is electrically connected to a plurality of first power lines; and
   wherein the orthographic projection of the partition control signal lead on the base substrate is located between the orthographic projection of the first initialization signal lead on the base substrate and an orthographic projection of a first power lead the base substrate.

15. The display substrate according to claim 14, wherein the display substrate comprises:
   a semiconductor layer disposed on the base substrate;
   a first gate layer disposed on a side of the semiconductor layer away from the base substrate;
   a second gate layer disposed on a side of the first gate layer away from the base substrate;
   a first metal conductive layer disposed on a side of the second gate layer away from the base substrate;
   a second metal conductive layer disposed on a side of the first metal conductive layer away from the base substrate; and
   a first electrode layer disposed on a side of the second metal conductive layer away from the base substrate, wherein the plurality of partition control signal leads and a plurality of the first initialization signal leads are all located in the second metal conductive layer;

wherein the display substrate further comprises: a plurality of bridging lines disposed on the base substrate and located in the first sub-region, wherein the plurality of bridging lines are located in the first metal conductive layer;

a plurality of first connecting lines disposed on the base substrate and located in the first sub-region; and a plurality of second connecting lines disposed on the base substrate and located in the first sub-region, wherein at least a part of the second connecting lines is located in the second metal conductive layer, and wherein the first initialization signal lead is electrically connected to a first end of at least one of the plurality of first connecting lines by crossing at least one of the plurality of partition control signal leads through at least one of the plurality of bridging lines, and a second end of the first connecting line is electrically connected to at least one of the flip-chip thin films; wherein at least one of the plurality of partition control signal leads is electrically connected to at least one of the flip-chip thin films through at least one of the plurality of second connecting lines, and for at least one of the plurality of partition control signal leads, the partition control signal lead comprises a first part electrically connected to the second connecting line and a second part crossed by the bridging line, and an orthographic projection of the first part on the base substrate is spaced apart from an orthographic projection of the second part on the base substrate.

16. The display substrate according to claim 15, wherein for at least one of the plurality of partition control signal leads, the orthographic projection of the first part on the base substrate is located between the orthographic projection of the second part on the base substrate and an orthographic projection of a center of the partition control signal lead on the base substrate;

wherein the display substrate further comprises a first insulating layer disposed between the first metal conductive layer and the second metal conductive layer, and a plurality of first via holes and a plurality of second via holes are provided on the first insulating layer;

wherein at least one of the bridging lines is electrically connected to the first initialization lead through at least one of the plurality of first via holes, and the at least one of the bridging lines is electrically connected to at least one of the first connecting lines through at least one of the second via holes;

wherein an orthographic projection of at least one of the first via holes on the base substrate at least partially overlaps with the orthographic projection of the first initialization lead on the base substrate, a recess is provided on at least one of the partition control signal leads, and an orthographic projection of the recess on the base substrate at least partially overlaps with an orthographic projection of at least one of the second via holes on the base substrate;

wherein at least one of the first via holes and at least one of the second via holes are arranged in the second direction;

wherein at least one of the first connecting lines comprises a first connecting part and a second connecting part, and at least one of the second connecting lines comprises a third connecting part and a fourth connecting part;

wherein for one and same first connecting line, a first end of the first connecting part is electrically connected to at least one of the bridging lines, and a second end of the first connecting part is electrically connected to at least one of the flip-chip thin films through the second connecting part;

wherein for one and same second connecting line, a first end of the third connecting part is electrically connected to at least one of the partition control signal leads, and a second end of the third connecting part is electrically connected to at least one of the flip-chip thin films through the fourth connecting part;

wherein the first connecting part and the third connecting part are both located in the second metal conductive layer, and the second connecting part and the fourth connecting part are both located in the first metal conductive layer;

wherein the display substrate further comprises a first insulating layer disposed between the first metal conductive layer and the second metal conductive layer, and a plurality of third via holes and a plurality of fourth via holes are provided on the first insulating layer;

wherein for one and same first connecting line, the first connecting part is electrically connected to the second connecting part through at least one of the third via holes;

wherein for one and same second connecting line, the third connecting part is electrically connected to the fourth connecting part through at least one of the fourth via holes;

wherein an orthographic projection of a connecting line between two adjacent third via holes on the base substrate is located on a side of an orthographic projection of a connecting line between two adjacent fourth via holes on the base substrate away from the orthographic projection of the display region on the base substrate; and wherein the partition control signal line and the first initialization signal line are both located in the second metal conductive layer.

17. A display panel, comprising the display substrate according to claim 1.

18. A display device, comprising the display panel according to claim 17.

19. A method of driving the display substrate according to claim 1, wherein the method comprises:

controlling the plurality of sub-pixels in a first display region to refresh at a first refresh rate, in response to a first partition control signal on at least one of the plurality of partition control signal lines; and controlling the plurality of sub-pixels in a second display region to refresh at a second refresh rate, in response to a second partition control signal on at least another of the plurality of partition control signal lines, wherein the first display region and the second display region are different sub-regions of the display region, respectively, and the first refresh rate is higher than the second refresh rate.

* * * * *

UNITED STATES PATENT AND TRADEMARK OFFICE
CERTIFICATE OF CORRECTION

PATENT NO. : 12,230,210 B2  
APPLICATION NO. : 18/547182  
DATED : February 18, 2025  
INVENTOR(S) : Liu Wu Page 1 of 1

It is certified that error appears in the above-identified patent and that said Letters Patent is hereby corrected as shown below:

On the Title Page

Item (73) Assignee, Please change "Heifei BOE Joint Technology Co., Ltd." to --Hefei BOE Joint Technology Co., Ltd.--.

Signed and Sealed this  
Twenty-sixth Day of August, 2025

Coke Morgan Stewart  
*Acting Director of the United States Patent and Trademark Office*